United States Patent
Anderson et al.

(10) Patent No.: US 8,232,164 B2
(45) Date of Patent: Jul. 31, 2012

(54) DAMASCENE METHOD OF FORMING A SEMICONDUCTOR STRUCTURE AND A SEMICONDUCTOR STRUCTURE WITH MULTIPLE FIN-SHAPED CHANNEL REGIONS HAVING DIFFERENT WIDTHS

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 12/915,463

(22) Filed: Oct. 29, 2010

(65) Prior Publication Data

US 2012/0104538 A1    May 3, 2012

(51) Int. Cl.
 *H01L 21/8234* (2006.01)
(52) U.S. Cl. ......... 438/257; 438/400; 438/585; 438/703
(58) Field of Classification Search .................. 438/275, 438/400, 585, 703
See application file for complete search history.

(56) References Cited

U.S. PATENT DOCUMENTS

| | | | |
|---|---|---|---|
| 6,951,784 | B1 | 10/2005 | Anderson et al. |
| 6,962,843 | B2 | 11/2005 | Anderson et al. |
| 7,084,018 | B1 | 8/2006 | Ahmed et al. |
| 7,087,506 | B2 | 8/2006 | Anderson et al. |
| 7,329,913 | B2 | 2/2008 | Brask et al. |
| 7,456,476 | B2 | 11/2008 | Hareland et al. |
| 7,476,578 | B1 | 1/2009 | Cheng et al. |
| 7,510,939 | B2 | 3/2009 | Furukawa et al. |
| 7,638,381 | B2 | 12/2009 | Cheng et al. |
| 2005/0093154 | A1 | 5/2005 | Kottantharayil et al. |
| 2008/0149593 | A1 | 6/2008 | Bai et al. |
| 2009/0206374 | A1 | 8/2009 | Anderson et al. |

OTHER PUBLICATIONS

Nowak et al., "Turning Silicon on its Edge: Overcoming Silicon Scaling Barriers with Double-Gate and FinFET Technology", IEEE Circuits & Devices Magazine, Jan./Feb. 2004, pp. 20-31.
Liao et al., "A Thin FinFET Si-Fin Body Structure Fabricated with 193nm Scanner Photolithography and Composite Hard Mask Etching Technique Upon Bulk-Si Substrate," SPIE Digital Library, vol. 6520, Mar. 4, 2010.

*Primary Examiner* — Long Pham
(74) *Attorney, Agent, or Firm* — Gibb & Riley, LLC; Richard M. Kotulak, Esq.

(57) ABSTRACT

Disclosed is a damascene method for forming a semiconductor structure and the resulting semiconductor structure having multiple fin-shaped channel regions with different widths. In the method, fin-shaped channel regions are etched using differently configured isolating caps as masks to define the different widths. For example, a wide width isolating cap can comprise a dielectric body positioned laterally between dielectric spacers and can be used as a mask to define a relatively wide width channel region; a medium width isolating cap can comprise a dielectric body alone and can be used as a mask to define a medium width channel region and/or a narrow width isolating cap can comprise a dielectric spacer alone and can be used as a mask to define a relatively narrow width channel region. These multiple fin-shaped channel regions with different widths can be incorporated into either multiple multi-gate field effect transistors (MUGFETs) or a single MUGFET.

10 Claims, 30 Drawing Sheets

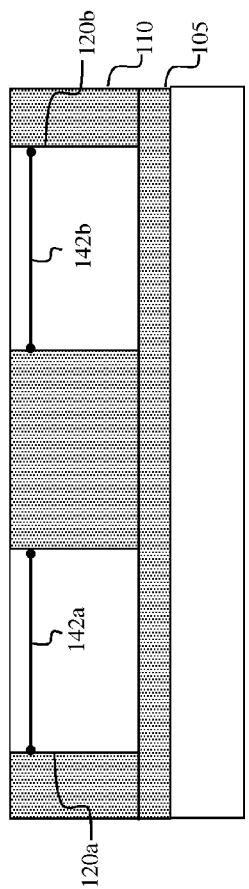
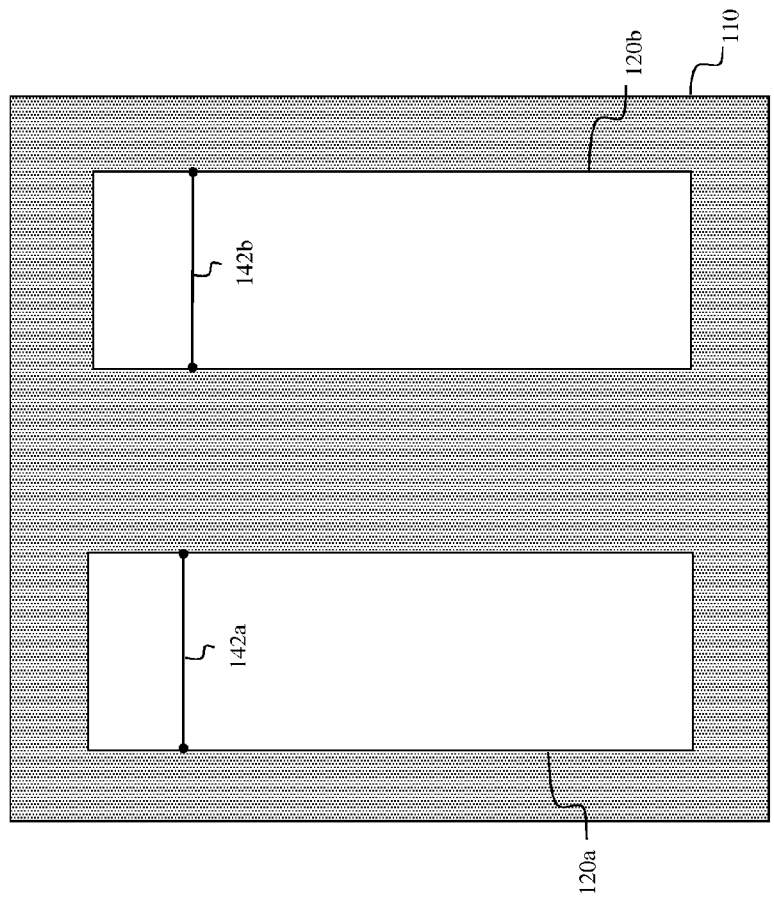
Figure 2A
Figure 2B

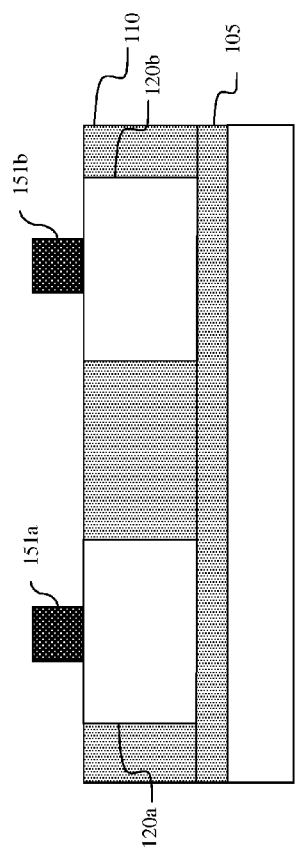
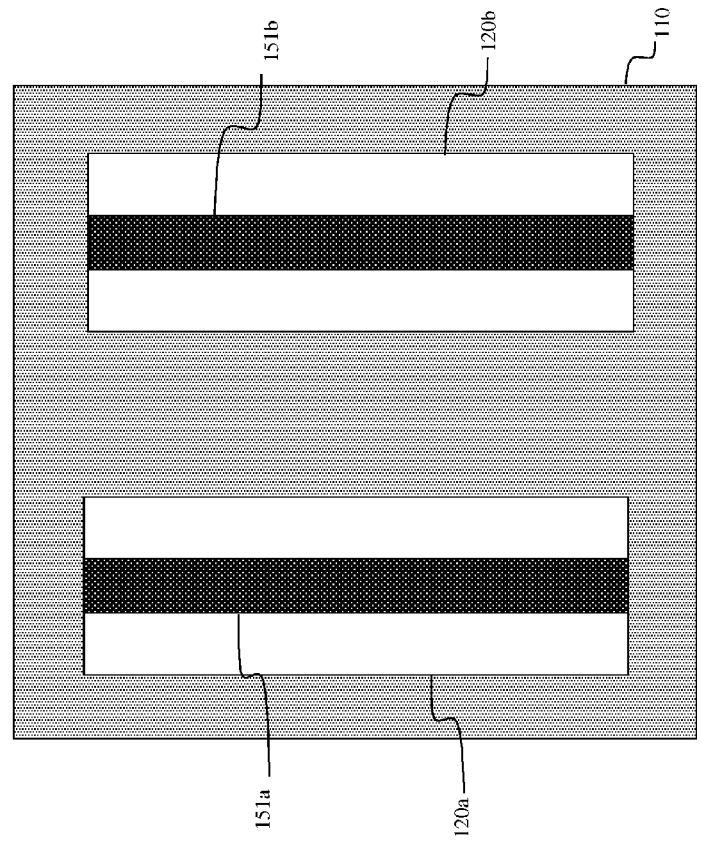
Figure 3A
Figure 3B

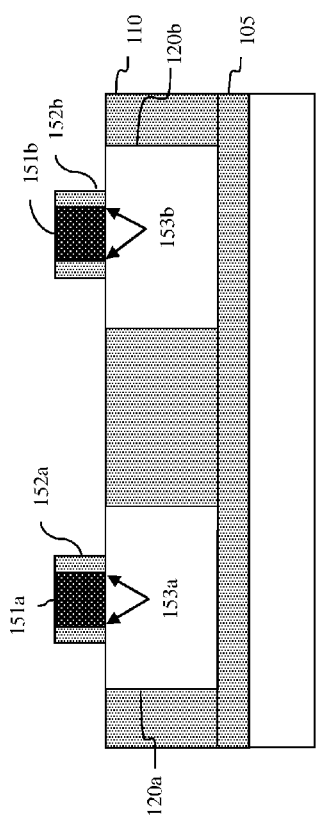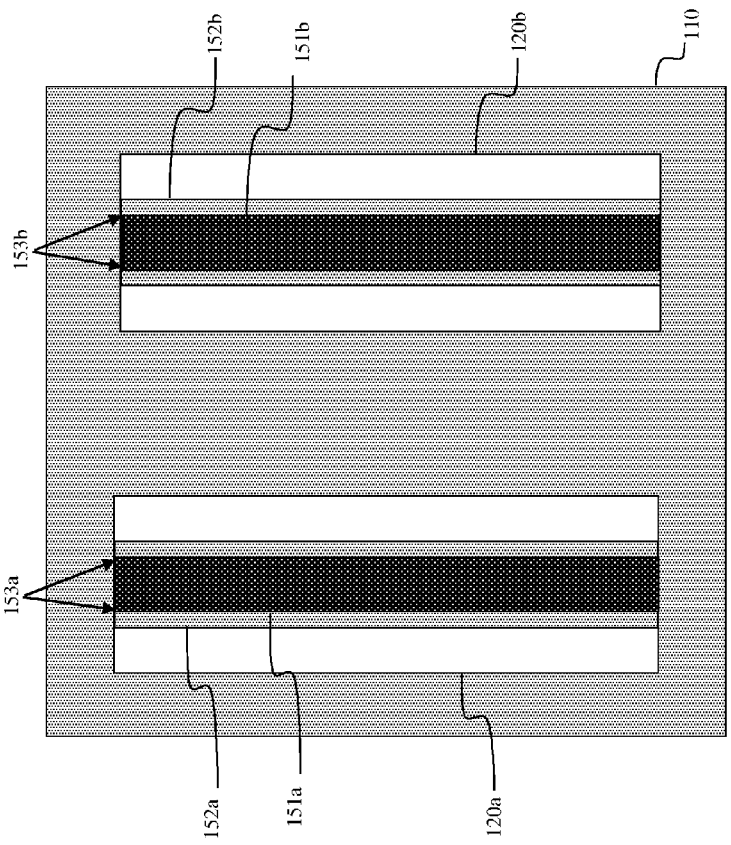

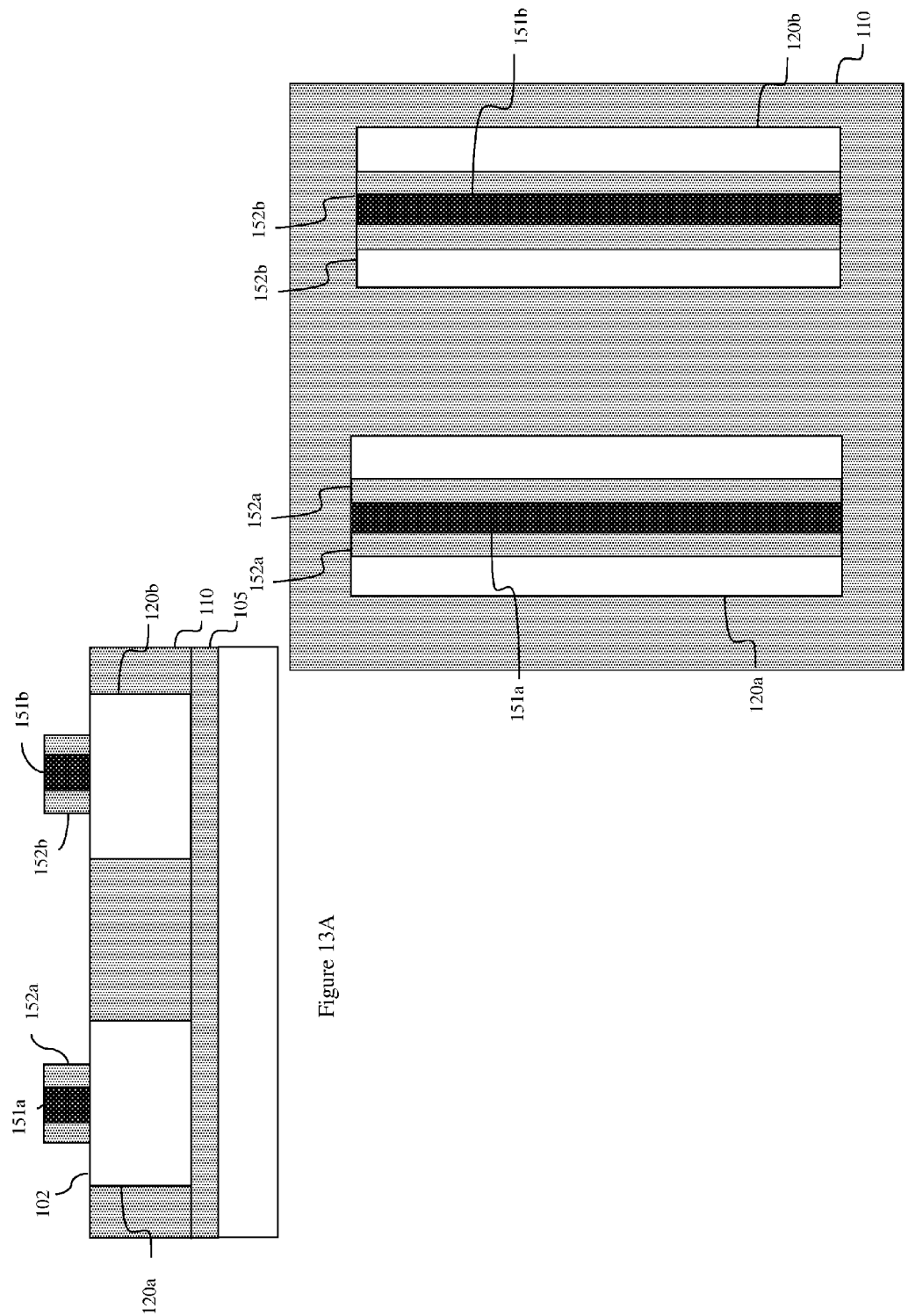

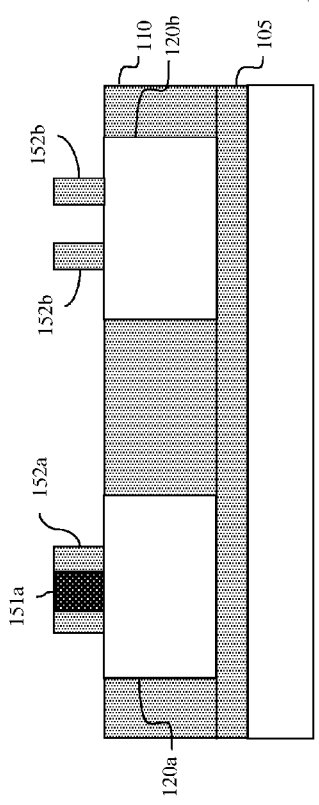
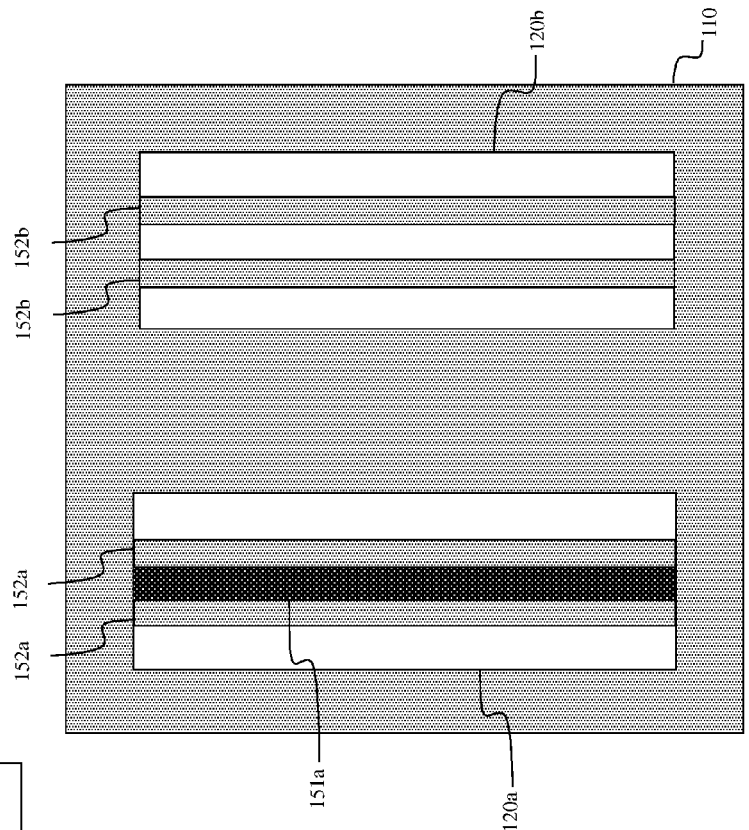
Figure 14A
Figure 14B

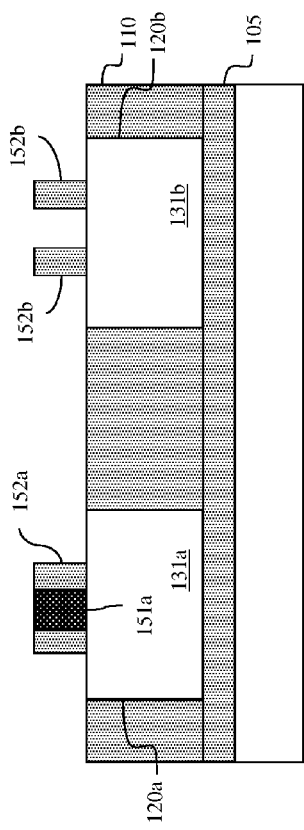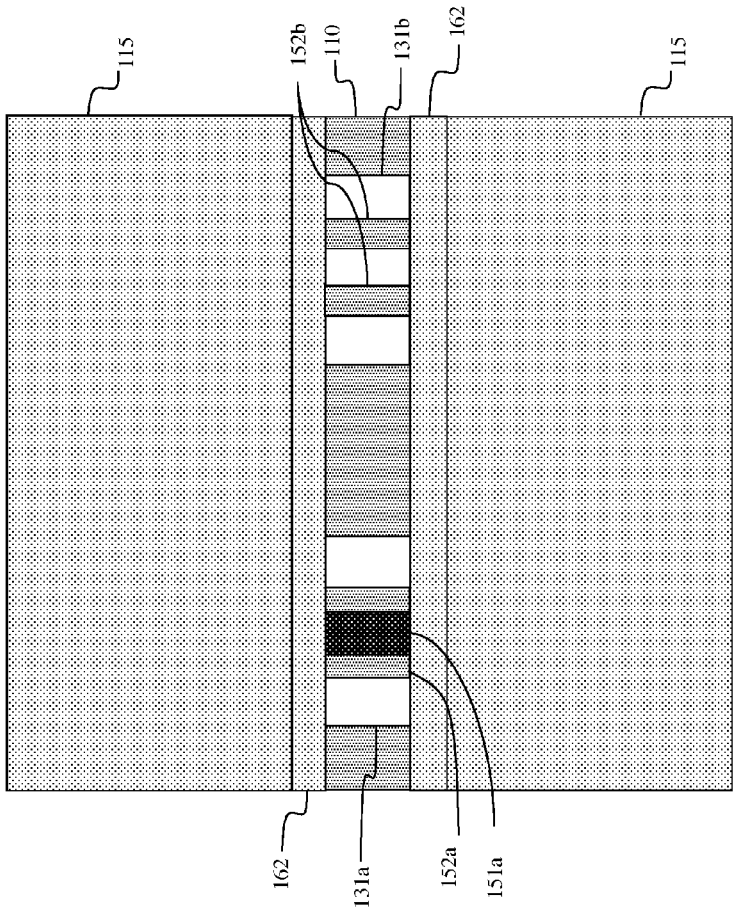

DAMASCENE METHOD OF FORMING A SEMICONDUCTOR STRUCTURE AND A SEMICONDUCTOR STRUCTURE WITH MULTIPLE FIN-SHAPED CHANNEL REGIONS HAVING DIFFERENT WIDTHS

BACKGROUND

1. Field of the Invention

The present invention relates to embodiments of a damascene method of forming a semiconductor structure and to embodiments of a semiconductor structure with multiple fin-shaped channel regions having different widths.

2. Description of the Related Art

Integrated circuit design decisions are often driven by device scalability and manufacturing efficiency. For example, because size scaling of planar field effect transistors (FETs) resulted in reduced drive current as a function of reduced channel width, non-planar multi-gate field effect transistors (MUGFETs) (e.g., dual-gate FETs and tri-gate FETs) were developed to provide scaled devices with increased drive current and reduced short channel effects. A dual-gate FET (also referred to as a fin-type FET or FINFET) is a non-planar FET comprising a relatively thin semiconductor fin with a channel region at the center of the fin positioned laterally between source/drain regions at the ends of the fin. A gate structure is adjacent to the opposing sides of the channel region and an isolating cap is on the top surface of the channel region. Thus, the dual-gate FET exhibits two-dimensional field effects. A tri-gate FET is similar in structure to a dual-gate FET. However, the semiconductor fin of a tri-gate FET is typically wider and the gate structure is adjacent to both the opposing sides and the top surface of the channel region. Thus, the tri-gate FET exhibits three-dimensional field effects.

During MUGFET processing, device performance can be tuned by adjusting the width of the semiconductor fin in the source/drain regions and/or channel region and also by incorporating multiple semiconductor fins into a single MUGFET. Unfortunately, tuning device performance in this manner is limited by current MUGFET processing techniques. For example, if one or more relatively thin semiconductor fins are formed for a dual-gate or tri-gate FET and then one or more dopant implantation processes (e.g., source/drain extension implantation, halo implantation, source/drain implantation, etc.) are performed, fin damage can occur. The risk of damage increases significantly as the fin width within the channel region decreases. Therefore, there is a need in the art for an improved method of forming MUGFETs.

SUMMARY

In view of the foregoing, disclosed herein are embodiments of a damascene method for forming a semiconductor structure and also the resulting semiconductor structure having multiple fin-shaped channel regions with different widths. During damascene processing and, particularly, after source/drain and other dopant implantation processes are performed, fin-shaped channel regions are etched using differently configured isolating caps as masks to define the different channel region widths. For example, a wide width isolating cap can comprise a dielectric body positioned laterally between dielectric spacers and can be used as a mask to define a relatively wide width channel region; a medium width isolating cap can comprise a dielectric body alone and can be used as a mask to define a medium width channel region and/or a narrow width isolating cap can comprise a dielectric spacer alone and can be used as a mask to define a relatively narrow width channel region. These multiple fin-shaped channel regions with different widths can be incorporated into either multiple different non-planar multi-gate field effect transistors (MUGFETs) or a single MUGFET. By defining the fin-shaped channel regions after source/drain and other dopant implantation processes are performed, channel region damage can be avoided.

One embodiment of a method of forming a semiconductor structure having multiple fin-shaped channel regions with different widths can comprise providing a semiconductor layer on an insulator layer. A trench isolation structure can be formed so as to define, in the semiconductor layer, a first semiconductor region for a first non-planar multi-gate field effect transistor (MUGFET) and a second semiconductor region, positioned laterally adjacent to the first semiconductor region, for a second MUGFET.

After the first semiconductor region and second semiconductor region are defined, a first dielectric body can be formed on the first semiconductor region and at the same time a second dielectric body can be formed on the second semiconductor region. The first dielectric body and the second dielectric body can specifically be formed so that they are essentially identical, so that they traverse the length of the first semiconductor region and second semiconductor region, respectively, and further so that they are narrower than the first semiconductor region and the second semiconductor region, respectively. Once the first dielectric body and second dielectric body are formed, first dielectric spacers can be formed on first opposing sides of the first dielectric body.

Next, a sacrificial layer can be formed so that it traverses the center portion of the first semiconductor region (i.e., the first center portion), leaving the end portions of the first semiconductor region (i.e., the first end regions) exposed and so that it traverses the center portion of the second semiconductor region (i.e., the second center portion), leaving the end portions of the second semiconductor region (i.e., the second end portions) exposed. It should be noted that this process will remove all dielectric material (i.e., the first dielectric body, first dielectric spacers, and second dielectric body) from above the first and second end portions, while leaving the dielectric material above the first and second center portions. After the sacrificial layer is formed, a blanket dielectric layer can be formed over the sacrificial layer, the first end portions and the second end portions and, then, planarized to expose the sacrificial layer. Once exposed, the sacrificial layer can be selectively removed.

Next, a directional etch process can be performed so as to remove exposed semiconductor material within the first center portion and the second center portion. During this directional etch process, the dielectric layer on the first end portions and the second end portions, the first dielectric body and the first dielectric spacers on the first center portion and the second dielectric body on the second center portion are used as masks. As a result, the first center portion will be essentially fin-shaped and will have a first width that is essentially equal to the combined width of the first dielectric spacers and first dielectric body. Also as a result, the second center portion will be essentially fin-shaped and will have a second width that is less than the first width and that is essentially equal to the width of the second semiconductor body.

Once the directional etch process is performed, a gate structure can be performed adjacent to the first center portion to complete the first MUGFET and adjacent to the second center portion to complete the second MUGFET. In this case the resulting first and second MUGFETs will be dual-gate FETs because the dielectric material on the top surfaces of the first and second center portions (i.e., the first dielectric body and first dielectric spacers on the first center portion and the second dielectric body on the second center portion) will function as isolating caps. However, optionally, prior to gate structure formation, all dielectric material can be selectively removed from above the first center portion and/or the second center portion so as to form tri-gate FET(s) instead of dual-gate FET(s).

An embodiment of a semiconductor structure formed according to this method embodiment can comprise a first semiconductor region for a first non-planar multi-gate field effect transistor (MUGFET) and a second semiconductor region, positioned laterally adjacent to the first semiconductor region, for a second MUGFET. The first semiconductor region and the second semiconductor region can be defined by a trench isolation structure. That is, a trench isolation structure on the insulator layer can laterally surround the first semiconductor region and the second semiconductor region such that the first semiconductor region is electrically isolated from the second semiconductor region. The first semiconductor region can have first end portions and a first center portion positioned laterally between the first end portions. The first center portion can be narrower than the first end portions (e.g., can be essentially fin-shaped) and can have a first width. Optionally, a first isolating cap can be positioned on the first center portion and can have the same first width. The first isolating cap can comprise a dielectric body positioned laterally between dielectric spacers. The second semiconductor region can have second end portions and a second center portion positioned laterally between the second end portions. The second center portion can be narrower than the second end portions (e.g., can be essentially fin-shaped) and can have a second width that is less than the first width. Optionally, a second isolating cap be positioned on the second center portion and can have the same second width. The second isolating cap can be essentially identical to the dielectric body of the first isolating cap.

Another embodiment of a method of forming a semiconductor structure having multiple fin-shaped channel regions with different widths can similarly comprise providing a semiconductor layer on an insulator layer. A trench isolation structure can be formed so as to define, in the semiconductor layer, a first semiconductor region for a first field effect transistor and a second semiconductor region, positioned laterally adjacent to the first semiconductor region, for a second field effect transistor.

After the first semiconductor region and second semiconductor region are defined, a first dielectric body can be formed on the first semiconductor region and at the same time a second dielectric body can be formed on the second semiconductor region. The first dielectric body and the second dielectric body can specifically be formed so that they are essentially identical, so that they traverse the length of the first semiconductor region and second semiconductor region, respectively, and further so that they are narrower than the first semiconductor region and the second semiconductor region, respectively. Once the first dielectric body and second dielectric body are formed, first dielectric spacers can be formed on first opposing sides of the first dielectric body and at the same time second dielectric spacers can be formed on second opposing sides of the second dielectric body. After the first and second dielectric spacers are formed, the second dielectric body can be selectively removed from the second dielectric spacers.

Next, a sacrificial layer can be formed so that it traverses the center portion of the first semiconductor region (i.e., the first center portion), leaving the end portions of the first semiconductor region (i.e., the first end portions) exposed and also so that it traverses the center portion of the second semiconductor region (i.e., the second center portion), leaving the end portions of the second semiconductor region (i.e., the second end portions) exposed. It should be noted that this process will remove all dielectric material (i.e., the first dielectric body, first dielectric spacers, and second dielectric spacers) from above the first and second end portions, while leaving the dielectric material above the first and second center portions. After the sacrificial layer is formed, a blanket dielectric layer can be formed over the sacrificial layer, the first end portions and the second end portions and, then, planarized to expose the sacrificial layer. Once exposed, the sacrificial layer can be selectively removed.

Next, a directional etch process can be performed so as to remove exposed semiconductor material within the first center portion and the second center portion. During this directional etch process, the dielectric layer on the first end portions and the second end portions, the first dielectric body and the first dielectric spacers on the first center portion and the second spacers on the second center portion are used as masks. As a result, the first center portion will be essentially fin-shaped and will have a first width equal to the combined width of the first dielectric spacers and first dielectric body and the second center portion will have two parallel sections, each section being essentially fin-shaped and having a second width that is less than the first width and equal to the width of one of the second dielectric spacers.

Once the directional etch process is performed, a gate structure can be performed adjacent to the first center portion to complete the first MUGFET and adjacent to the second center portion to complete the second MUGFET. In this case the resulting first and second MUGFETs will be dual-gate FETs because the dielectric material on the top surfaces of the first and second center portions (i.e., the first dielectric body and first dielectric spacers on the first center portion and the second dielectric spacers on the parallel sections of the second center portion) will function as isolating caps. However, optionally, prior to gate structure formation, all dielectric material can be selectively removed from above the first center portion and/or the second center portion so as to form tri-gate FET(s) instead of dual-gate FET(s).

An embodiment of a semiconductor structure formed according to this method embodiment can comprise a first semiconductor region for a first non-planar multi-gate field effect transistor (MUGFET) and a second semiconductor region, positioned laterally adjacent to the first semiconductor region, for a second MUGFET. The first semiconductor region and the second semiconductor region can be defined by a trench isolation structure. That is, a trench isolation structure on the insulator layer can laterally surround the first semiconductor region and the second semiconductor region such that the first semiconductor region is electrically isolated from the second semiconductor region. The first semiconductor region can have first end portions and a first center portion positioned laterally between the first end portions. The first center portion can be narrower than the first end portions (e.g., can be essentially fin-shaped) and can have a first width. Optionally, a first isolating cap can be positioned on the first center portion and can have the same first width. The first isolating cap can comprise a dielectric body positioned laterally between dielectric spacers. The second semiconductor region can have second end portions and a second center portion positioned laterally between the second end portions. The second center portion can be narrower than the second end portions and can comprise two parallel sections. Each of these parallel sections can be essentially fin-shaped and can have a second width that is less than the first width. Optionally, second isolating caps can be positioned on the parallel sections and can have the same second width. Each second isolating cap can be essentially identical to one of the dielectric spacers of the first isolating cap.

The above-described method embodiments form the multiple fin-shaped channel regions with different widths on different semiconductor regions (i.e., a first semiconductor region and a second semiconductor region). However, it should be understood that similar techniques could also be used to form such multiple fin-shaped channel regions with different widths on the same semiconductor region. Thus, also disclosed herein are embodiments of a semiconductor structure that comprises a semiconductor region. The semiconductor region can be defined by a trench isolation structure. That is, a trench isolation structure can laterally surround the semiconductor region. The semiconductor region can have end portions and a center portion positioned laterally between the end portions. The center portion can be narrower than the end portions and can comprise a plurality of parallel essentially fin-shaped sections. At least two of the parallel sections can have different widths. Optionally, a first isolating cap, having a first width, can be positioned on a first one of the parallel sections, having the same first width. The first isolating cap can comprise a dielectric body positioned laterally between dielectric spacers. Optionally, a second isolating cap, having a second width that is less than the first width, can be positioned on a second one of the parallel sections, having the same second width. This second isolating cap can be essentially identical to either the dielectric body of the first isolating cap or essentially identical to one of the dielectric spacers of the first isolating cap.

BRIEF DESCRIPTION OF THE SEVERAL VIEWS OF THE DRAWINGS

The embodiments disclosed herein will be better understood with reference to the drawings, which are not necessarily drawn to scale and in which:

FIG. 2A is a cross-section drawing illustrating a partially completed semiconductor structure formed according to the method of FIG. 1;

FIG. 2B is a top view drawing of the same partially completed semiconductor structure as shown in FIG. 2A;

FIG. 3A is a cross-section drawing illustrating a partially completed semiconductor structure formed according to the method of FIG. 1;

FIG. 3B is a top view drawing of the same partially completed semiconductor structure as shown in FIG. 3A;

FIG. 4A is a cross-section drawing illustrating a partially completed semiconductor structure formed according to the method of FIG. 1;

FIG. 4B is a top view drawing of the same partially completed semiconductor structure as shown in FIG. 4A;

FIG. 13A is a cross-section drawing illustrating a partially completed semiconductor structure formed according to the method of FIG. 12;

FIG. 13B is a top view drawing of the same partially completed semiconductor structure as shown in FIG. 13A;

FIG. 14A is a cross-section drawing illustrating a partially completed semiconductor structure formed according to the method of FIG. 12;

FIG. 14B is a top view drawing of the same partially completed semiconductor structure as shown in FIG. 14A;

FIG. 18A is a cross-section drawing illustrating a partially completed semiconductor structure formed according to the method of FIG. 12;

FIG. 18B is a top view drawing of the same partially completed semiconductor structure as shown in FIG. 18A;

DETAILED DESCRIPTION

Figure 1:
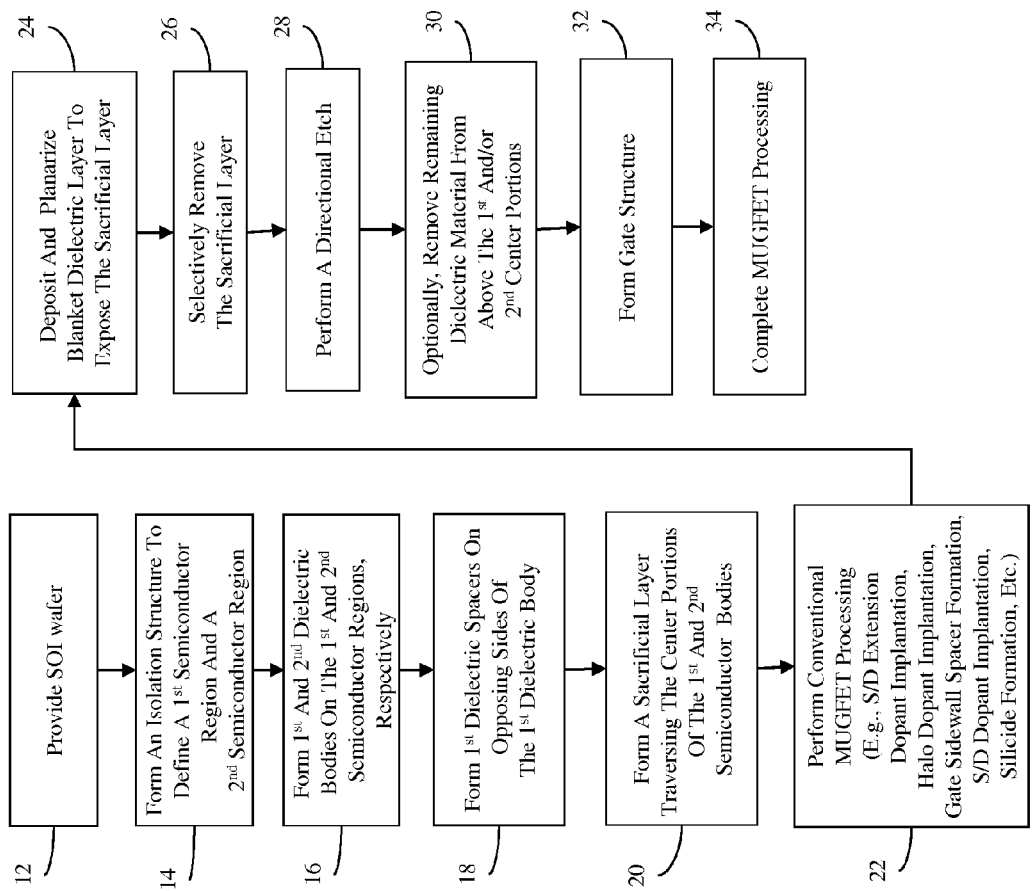
FIG. 1 is a flow diagram illustrating an embodiment of a damascene method of forming a semiconductor structure.

The embodiments of the invention and the various features and advantageous details thereof are explained more fully with reference to the non-limiting embodiments that are illustrated in the accompanying drawings and detailed in the following description.

As discussed above, integrated circuit design decisions are often driven by device scalability and manufacturing efficiency. For example, because size scaling of planar field effect transistors (FETs) resulted in reduced drive current as a function of reduced channel width, non-planar multi-gate field effect transistors (MUGFETs) (e.g., dual-gate FETs and tri-gate FETs) were developed to provide scaled devices with increased drive current and reduced short channel effects. A dual-gate FET (also referred to as a fin-type FET or FINFET) is a non-planar FET comprising a relatively thin semiconductor fin with a channel region at the center of the fin positioned laterally between source/drain regions at the ends of the fin. A gate structure is adjacent to the opposing sides of the channel region and an isolating cap is on the top surface of the channel region. Thus, the dual-gate FET exhibits two-dimensional field effects. A tri-gate FET is similar in structure to a dual-gate FET. However, the semiconductor fin of a tri-gate FET is typically wider and the gate structure is adjacent to both the opposing sides and the top surface of the channel region. Thus, the tri-gate FET exhibits three-dimensional field effects.

During MUGFET processing, device performance can be tuned by adjusting the width of the semiconductor fin in the source/drain regions and/or channel region and also by incorporating multiple semiconductor fins into a single MUGFET. Unfortunately, tuning device performance in this manner is limited by current MUGFET processing techniques. For example, if one or more relatively thin semiconductor fins are formed for a dual-gate or tri-gate FET and then one or more dopant implantation processes (e.g., source/drain extension implantation, halo implantation, source/drain implantation, etc.) are performed, fin damage can occur. The risk of damage increases significantly as the fin width within the channel region decreases. Therefore, there is a need in the art for an improved method of forming MUGFETs.

In view of the foregoing, disclosed herein are embodiments of a damascene method for forming a semiconductor structure and also the resulting semiconductor structure having multiple fin-shaped channel regions with different widths. During damascene processing and, particularly, after source/drain and other dopant implantation processes are performed, fin-shaped channel regions are etched using differently configured isolating caps as masks to define the different channel region widths. For example, a wide width isolating cap can comprise a dielectric body positioned laterally between dielectric spacers and can be used as a mask to define a relatively wide width channel region; a medium width isolating cap can comprise a dielectric body alone and can be used as a mask to define a medium width channel region and/or a narrow width isolating cap can comprise a dielectric spacer alone and can be used as a mask to define a relatively narrow width channel region. These multiple fin-shaped channel regions with different widths can be incorporated into either multiple different non-planar multi-gate field effect transistors (MUGFETs) or a single MUGFET. By defining the fin-shaped channel regions after source/drain and other dopant implantation processes are performed, channel region damage can be avoided even with device size scaling.

More particularly, referring to FIG. 1, one embodiment of a method of forming a semiconductor structure with multiple fin-shaped channel regions having different widths can comprise providing a semiconductor-on-insulator (SOI) wafer (12). This SOI wafer can comprise, for example, a semiconductor substrate (e.g., a silicon substrate or other suitable semiconductor substrate), an insulator layer (e.g., a buried oxide (BOX) layer or other suitable insulator layer) on the substrate and a semiconductor layer on an insulator layer.

Next, a trench isolation structure 110 (e.g., a shallow trench isolation (STI) structure) can be formed so as to define, in the semiconductor layer on the insulator layer 105, a first semiconductor region 120a for a first non-planar multi-gate field effect transistors (MUGFET) and a second semiconductor region 120b, positioned laterally adjacent to the first semiconductor region 120a, for a second MUGFET (14, see FIGS. 2A and 2B). This isolation structure 110 can specifically be formed so that it extends vertically through the semiconductor layer to the insulator layer 105, so that it laterally surrounds and defines an essentially rectangular-shaped first semiconductor region 120a and also so that it laterally surrounds and defines an essentially rectangular-shaped second semiconductor region 120b. Thus, the isolation structure 110 is formed so that it electrically isolates the first semiconductor region 120a from the second semiconductor region 120b. It should be noted that the first semiconductor region 120a and second semiconductor region 120 can be defined (e.g., by lithographic patterning of the isolation structure 110) so that their widths 142a and 142b are essentially the same and so that their lengths are also essentially the same (as shown). Alternatively, the semiconductor regions 120a and 120b can be defined (e.g., by lithographic patterning of the isolation structure 110) so that their widths and/or lengths are different (not shown). Processing techniques for forming such a trench isolation structure 110 and, particularly, an STI structure are well-known in the art and are omitted from this specification in order to allow the reader to focus on the salient aspects of the invention.

After the first semiconductor region 120a and second semiconductor region 120b are defined at process 14, a first dielectric body 151a can be formed on the first semiconductor region 120a and at the same time a second dielectric body 151b can be formed on the second semiconductor region 120b (16, see FIGS. 3A and 3B). The first dielectric body 151a and the second dielectric body 151b can specifically be formed so that they are essentially identical, so that they traverse the length of the first semiconductor region 120a and second semiconductor region 120b, respectively, and further so that they are narrower than the first semiconductor region 120a and the second semiconductor region 120b, respectively. This can be accomplished, for example, by depositing a first dielectric hardmask layer and, then, patterning the first dielectric hardmask layer lithographically to create the discrete dielectric bodies 151a-b.

Figure 5A:
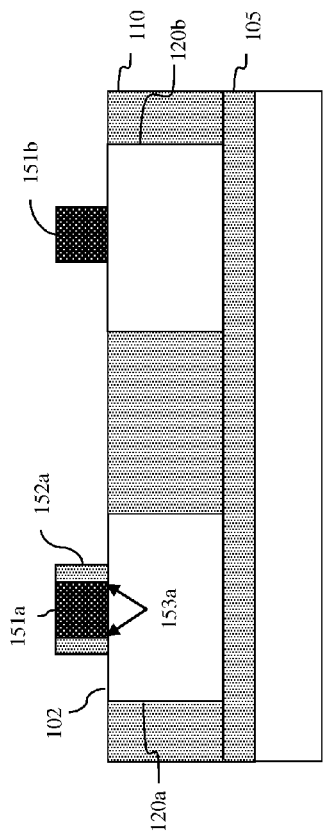
FIG. 5A is a cross-section drawing illustrating a partially completed semiconductor structure formed according to the method of FIG. 1.
Figure 5B:
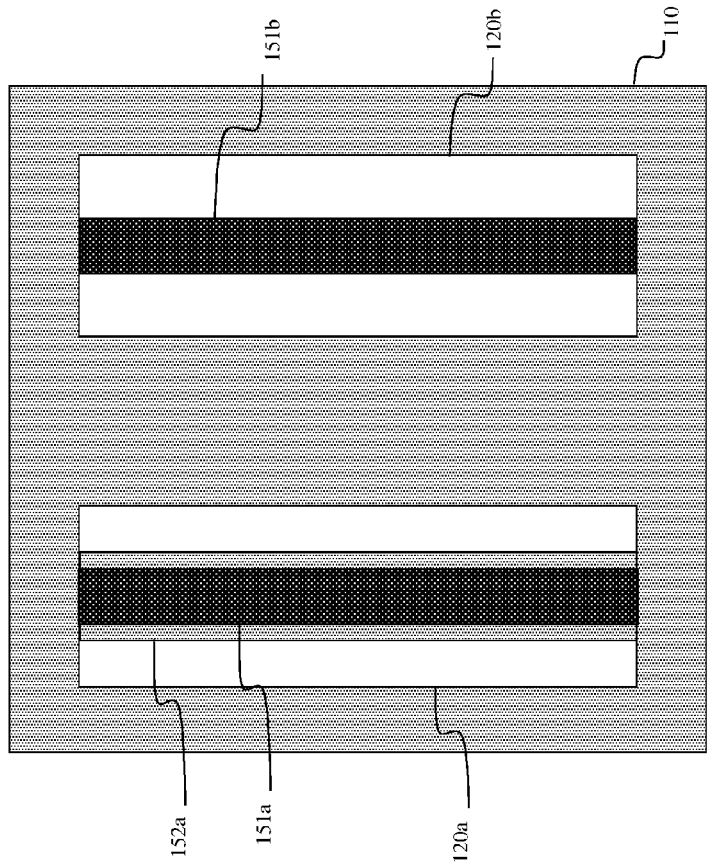
FIG. 5B is a top view drawing of the same partially completed semiconductor structure as shown in FIG. 5A.

Once the first dielectric body 151a and second dielectric body 151b are formed, first dielectric spacers 152a can be formed on first opposing sides 153a of the first dielectric body 152a (18, see FIGS. 5A-5B). However, processing should specifically be performed so that following this method step 18, dielectric spacers are not positioned laterally adjacent to opposing sides 153b of the second dielectric body 151b.

For example, a conformal second dielectric hardmask layer can be deposited. This second dielectric hardmask layer can comprise a different dielectric hardmask material than the first dielectric hardmask layer that was previously used at process 16 to form the first and second dielectric bodies 151a-b. The second dielectric hardmask layer can be selectively and anisotropically etched to form first dielectric spacers 152a on the opposing sides 153a of the first dielectric body 151a and second dielectric spacers 152b on the opposing sides 153b of the second dielectric body 151b (see FIGS. 4A and 4B). Then, the first semiconductor region 120a can be masked and the second dielectric spacers 152b can be selectively removed (see FIGS. 5A and 5B). Alternatively, a mask can be formed over the second semiconductor region 120b. Then, a second dielectric hardmask layer can be deposited over the first semiconductor region 120a. Again, this second dielectric hardmask layer can comprise a different dielectric hardmask material than the first dielectric hardmask layer that was previously used at process 16 to form the first and second dielectric bodies 151a-b. The second dielectric hardmask layer can then be selectively and anisotropically etched to form first dielectric spacers 152a on the opposing sides 153a of the first dielectric body only and the mask can be selectively removed.

As mentioned above, the dielectric bodies 151a-b and the dielectric spacers 152a-b should be formed so that they comprise different dielectric materials and, particularly, different dielectric materials that allow for selective etching of the dielectric spacers over the dielectric bodies. For example, the dielectric bodies 151a-b can be formed with silicon nitride and the dielectric spacers 152a-b can be formed with silicon oxide, silicon oxynitride or silicon carbide. These exemplary dielectric materials are offered for illustration purposes only and it should be understood that other combinations of dielectric materials may alternatively be used.

Figure 6A:
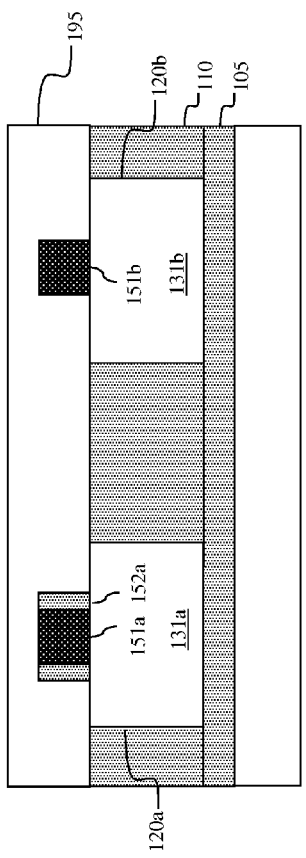
FIG. 6A is a cross-section drawing illustrating a partially completed semiconductor structure formed according to the method of FIG. 1.
Figure 6B:
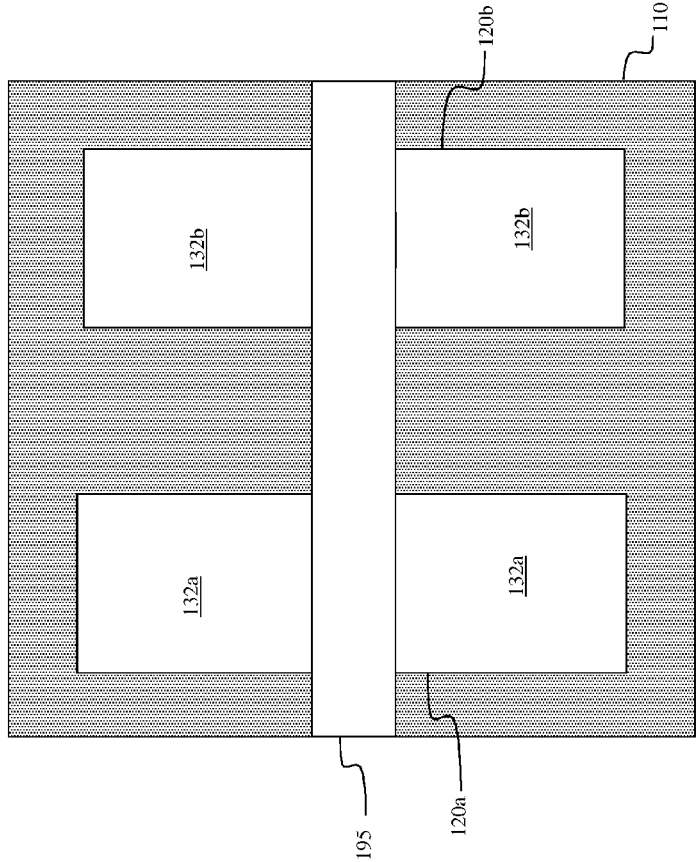
FIG. 6B is a top view drawing of the same partially completed semiconductor structure as shown in FIG. 6A.

Next, a sacrificial layer 195 (i.e., a sacrificial gate structure, a replacement gate structure, etc.) can be formed (20, see FIGS. 6A-6B). This sacrificial layer can comprise, for example, a polysilicon layer or other material that can be selectively etched at process 214, discussed below. Specifically, this sacrificial layer 195 can be deposited and patterned (e.g., lithographically) so that it traverses the center portion 131a (i.e., the first center portion or first designated channel region) of the first semiconductor region 120a covering the first dielectric body 151a and first dielectric spacers 152a and also so that it traverses the center portion 131b (i.e., the second center portion or second designated channel region) of the second semiconductor region 120b covering the second dielectric body 151b. Thus, the end portions 132a of the first semiconductor region 120a (i.e., the first end portions) and also the end portions 132b of the second semiconductor region 120b (i.e., the second end portions) will remain exposed. It should be noted that this process 210 will remove all dielectric material (i.e., the first dielectric body 151a, first dielectric spacers 152a, and second dielectric body 151b) from above the first and second end portions 132a-b, while leaving intact the dielectric material above the first and second center portions 131a-b.

Figure 7:
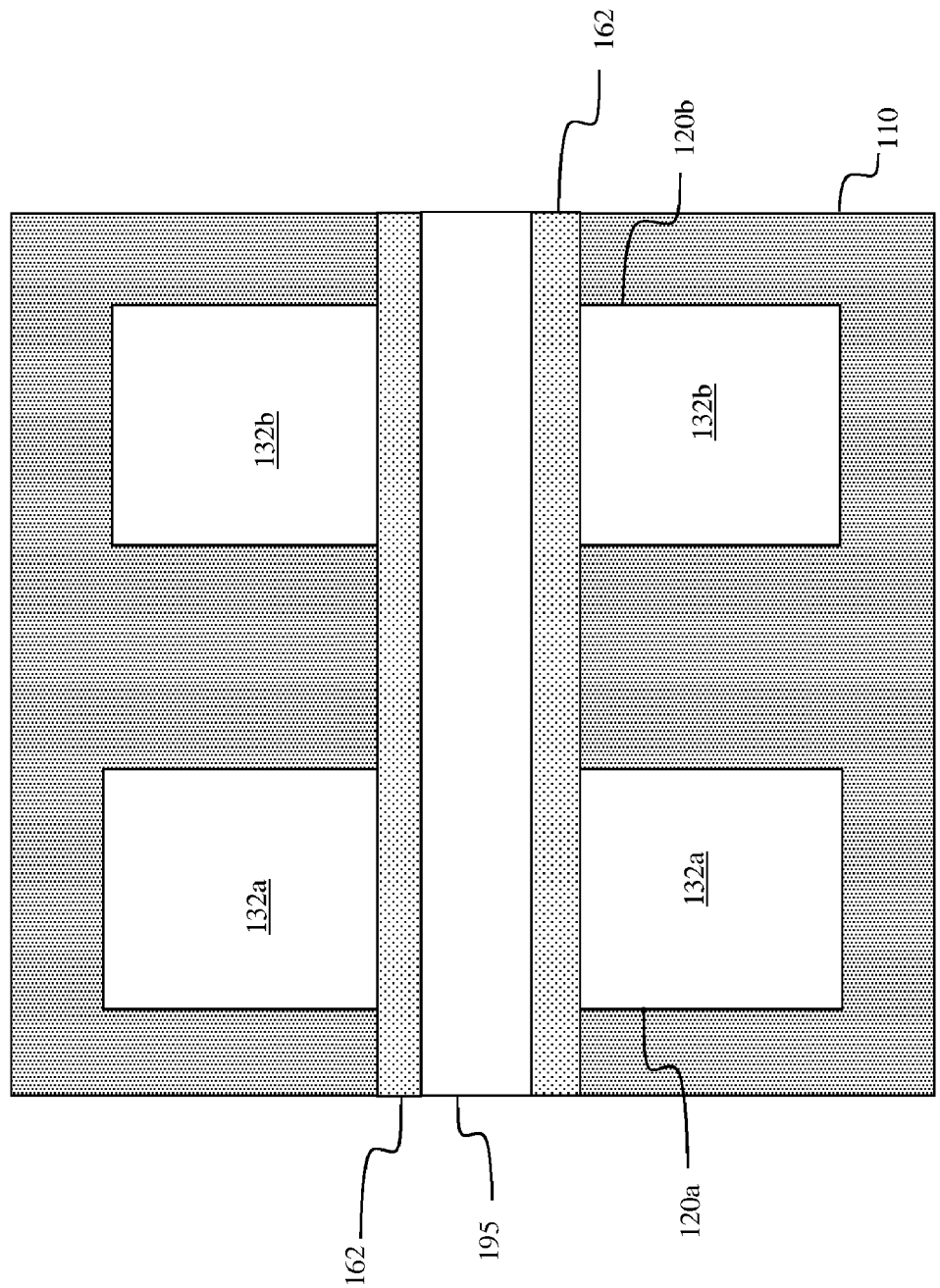
FIG. 7 is a top view drawing of a partially completed semiconductor structure formed according to the method of FIG. 1.

After the sacrificial layer 195 is formed at process 20, conventional MUGFET processing can be performed (22). This conventional MUGFET processing can include, but is not limited to, source/drain extension dopant implantation, halo dopant implantation, gate sidewall spacer 162 formation (see FIG. 7), source/drain dopant implantation into the first and second end portions 132a-b and silicide layer formation on the top surfaces of the first and second end portions 132a-b. It should be noted that this conventional processing will vary depending upon whether the MUGFETs being formed in the first semiconductor region 120a and the second semiconductor region are to have the same conductivity type (e.g., n-type or p-type) or opposite conductivity types (e.g., n-type and p-type, respectively). For example, if the MUGFETs are to have the same conductivity type the various dopant implantation processes can be performed essentially simultaneously. However, if the MUGFETs are to have opposite conductivity types, the end portions of one semiconductor region can be masked while dopant implantation is performed on the end portions of the other semiconductor region and vice versa.

Figure 8:
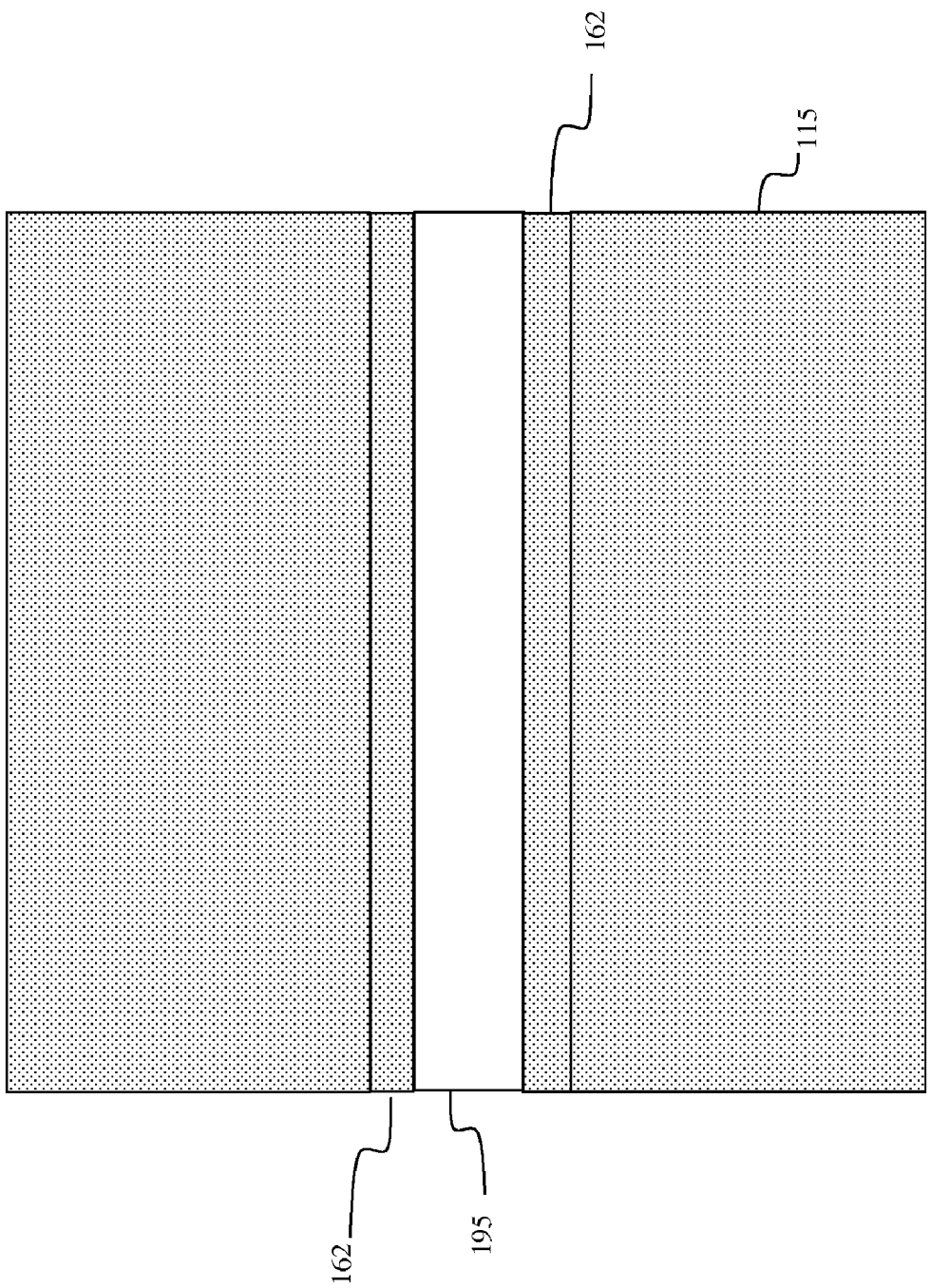
FIG. 8 is a top view drawing of a partially completed semiconductor structure formed according to the method of FIG. 1.

Next, a blanket dielectric layer 115 (e.g., an interlayer dielectric) can be formed (e.g., deposited) such that it extends over the sacrificial layer 195, the gate sidewall spacers 162, the first end portions 132a and the second end portions 132b. The blanket dielectric layer 115 can then be planarized (e.g., using a conventional chemical mechanical polishing (CMP) process) to expose the top surface of the sacrificial layer 195 (24, see FIG. 8).

Figure 9A:
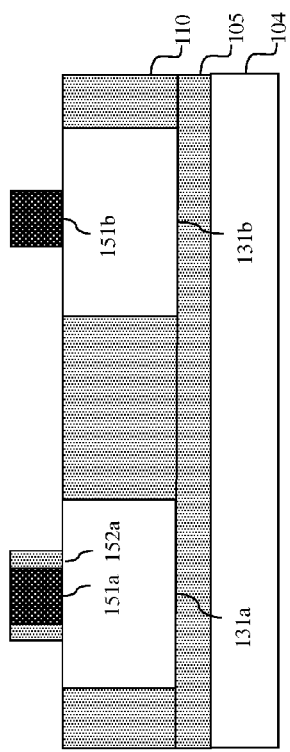
FIG. 9A is a cross-section drawing illustrating a partially completed semiconductor structure formed according to the method of FIG. 1.
Figure 9B:
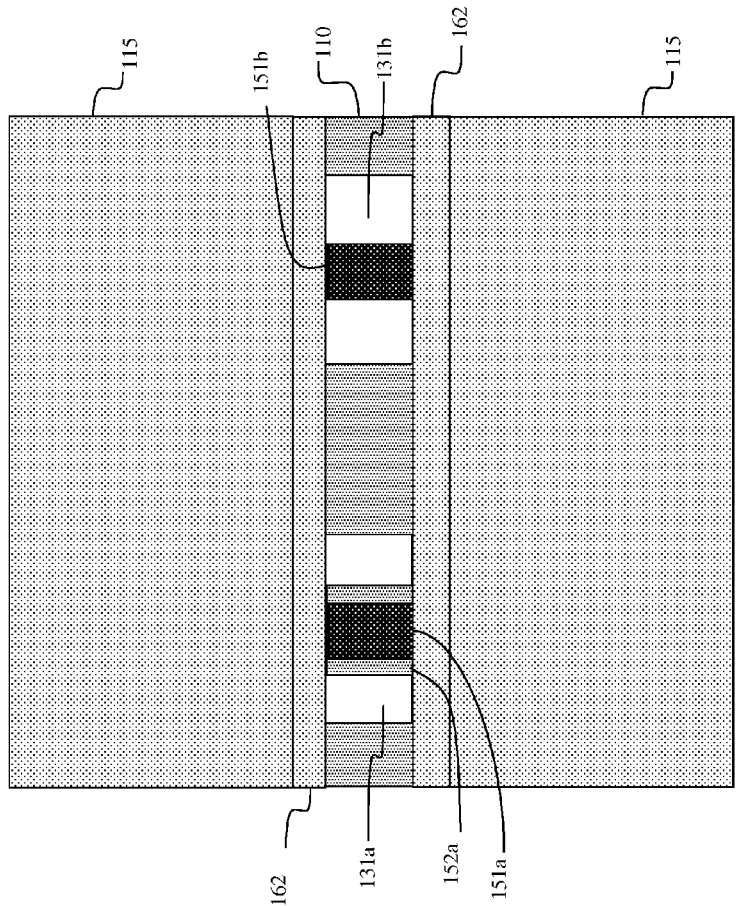
FIG. 9B is a top view drawing of the same partially completed semiconductor structure as shown in FIG. 9A.

Once exposed, the sacrificial layer 195 can be selectively removed (e.g., using a selective etch process) (26, see FIGS. 9A and 9B). This process 26 exposes the remaining portions of the first dielectric body 151a and the first dielectric spacers 152a as well as sections of the first center portion 131a of the first semiconductor region 120a between the first dielectric spacers 152a and the isolation structure 110. This process 26 also exposes the remaining portion of the second dielectric body 151b as well as sections of the second center portion 131b of the second semiconductor region 120b between the second dielectric body 151b and the isolation structure 110. Finally, this process 26 leaves the gate sidewall spacers 162 and dielectric layer 115 essentially intact.

Figure 10A:
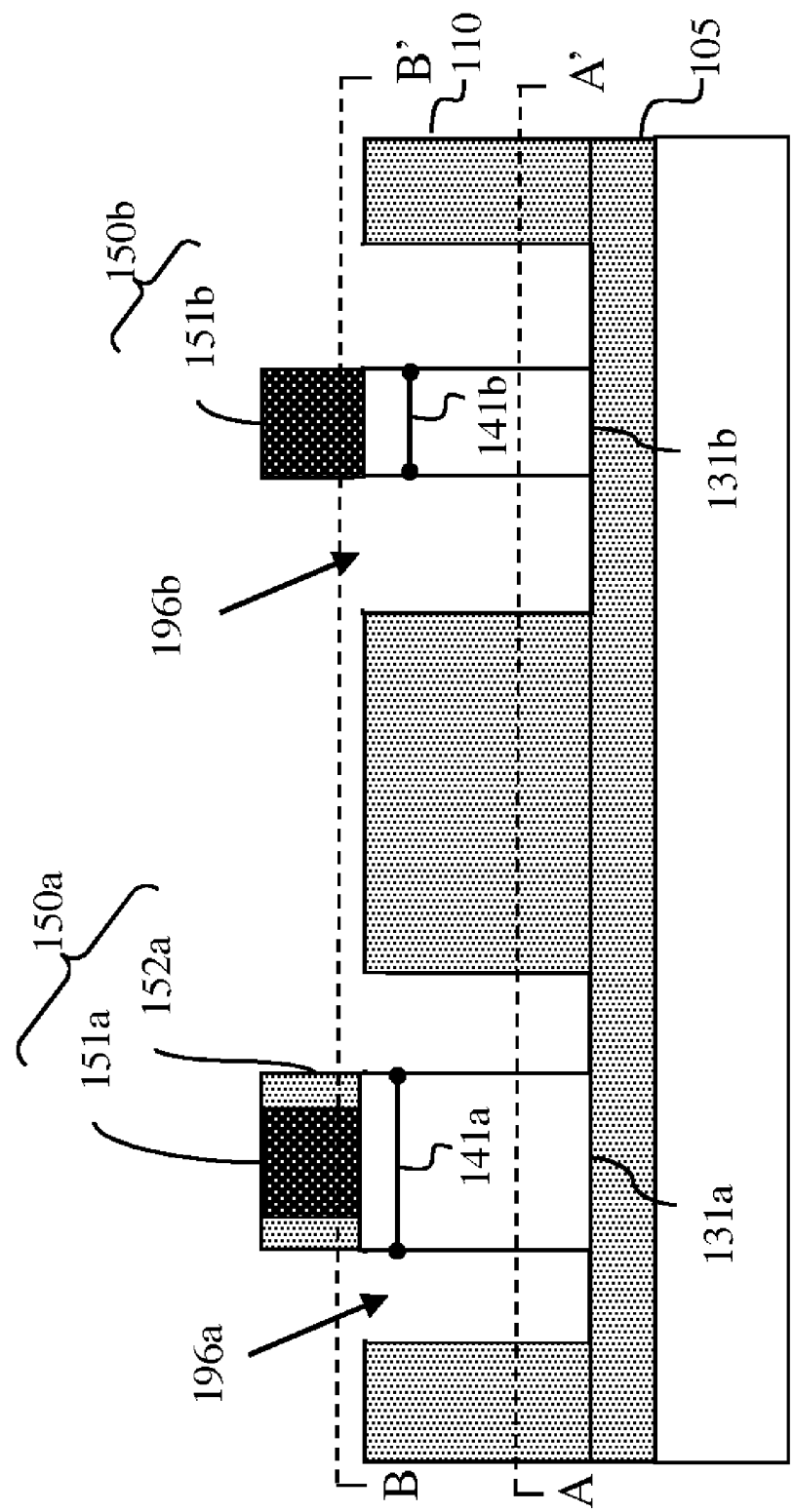
FIG. 10A is a vertical cross-section drawing illustrating a partially completed semiconductor structure formed according to the method of FIG. 1.
Figure 10B:
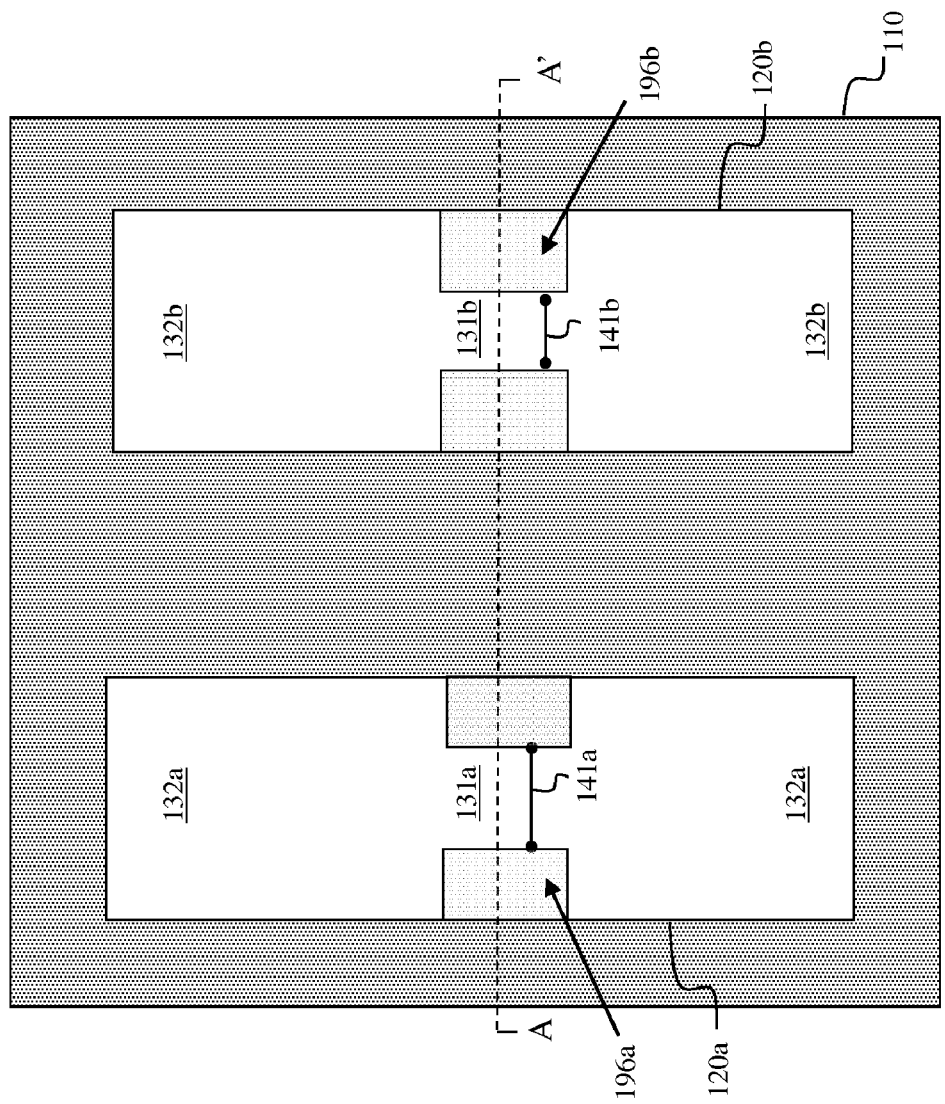
FIG. 10B is a horizontal cross-section drawing of the same partially completed semiconductor structure as shown in FIG. 10A.
Figure 10C:
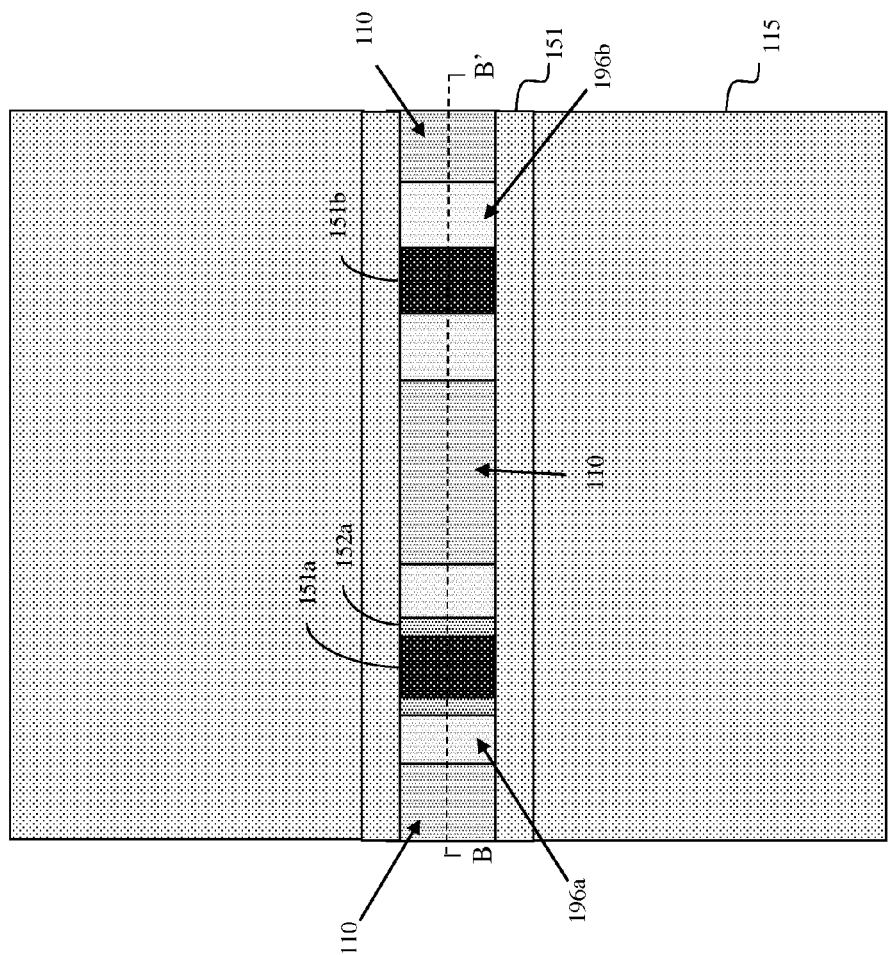
FIG. 10C is another horizontal cross-section drawing of the same partially completed semiconductor structure as shown in FIG. 10A.

Next, a directional etch process (e.g., a reactive ion etch (RIE) process) can be performed so as to remove exposed semiconductor material within the first center portion 131a of the first semiconductor region 120a and the second center portion 131b of the second semiconductor regions 120b (28, see FIGS. 10A-10C). During this directional etch process 28, the dielectric layer 115 on the first end portions 132a and the second end portions 132b, the first dielectric body 151a and the first dielectric spacers 152a on the first center portion 131a and the second dielectric body 151b on the second center portion 131b are used as masks. Thus, this directional etch process 28 forms openings 196a-196b that stop on the insulator layer 105 and, thereby turns the center portions 131a-b (i.e., the channel regions) of the semiconductor regions 120a-b, respectively, into essentially fin-shaped structures. More specifically, as a result of this directional etch process 28, the first center portion 131a of the first semiconductor region 120a will be narrower than the first end portions 132b and will have a first width 141a that is essentially equal to the combined width of the first dielectric body 151a and the first dielectric spacers 152a. Also as a result of this directional etch process 28, the second center portion 131b of the second semiconductor region 120b will be narrower than the second end portions 132b and will have a second width 141b that is less than the first width 141a and, more specifically, that is essentially equal to the width of the second dielectric body 151b (see FIG. 10B).

Figure 11A:
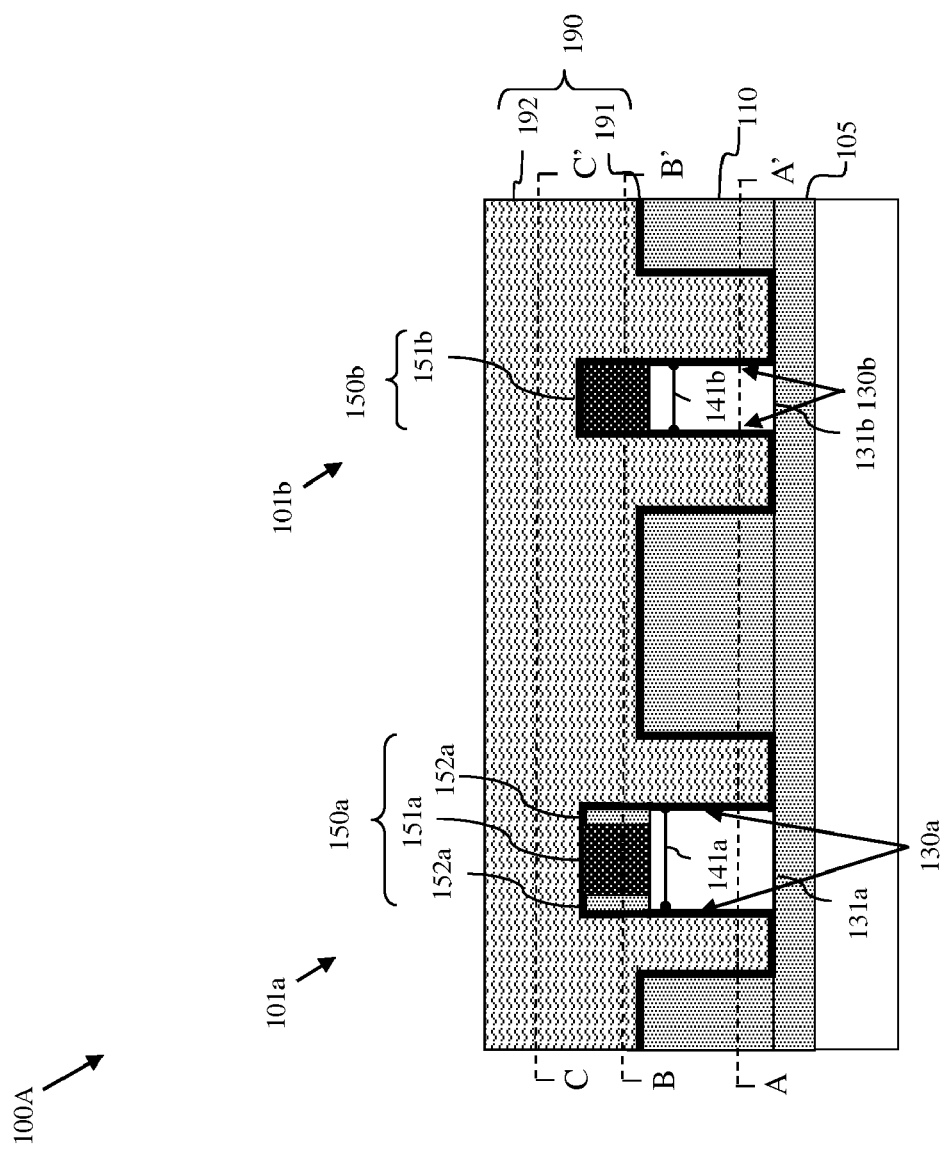
FIG. 11A is a vertical cross-section drawing illustrating a completed semiconductor structure formed according to the method of FIG. 1.
Figure 11B:
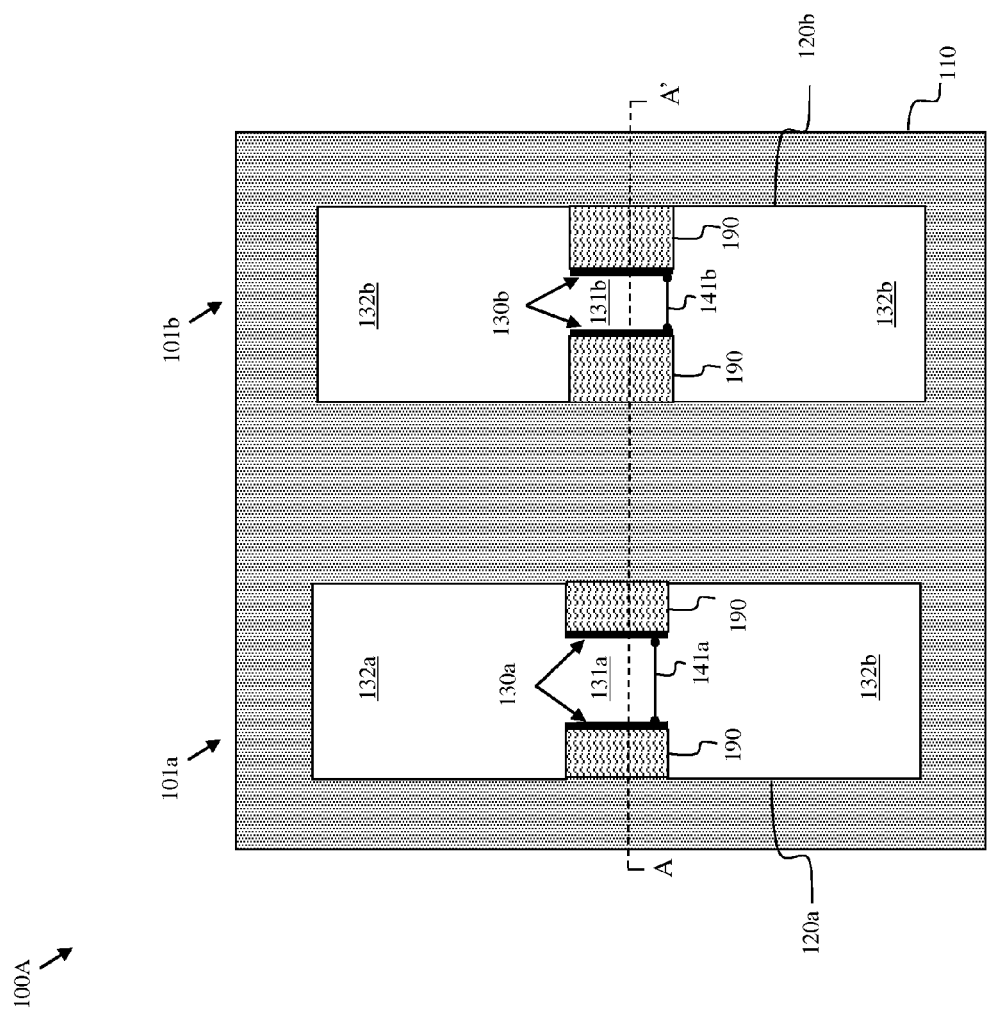
FIG. 11B is a horizontal cross-section drawing of the same completed semiconductor structure as shown in FIG. 11A.

After performing the directional etch process 28, a gate structure 190 can be formed on exposed first sidewalls 130a of the first center portion 131a and also on exposed second sidewalls 130b of the second center portion 131b (32, see FIGS. 11A-11B). For example, a conformal gate dielectric layer 191 (e.g., a gate oxide layer, a high-k gate dielectric layer or other suitable gate dielectric layer) can be formed (e.g., deposited) and a gate conductor layer 192 (e.g., a metal gate conductor layer, a polysilicon gate conductor layer, a dual work function gate conductor layer or other suitable gate conductor layer) can be formed (e.g., deposited) on the gate dielectric layer 191. The gate conductor layer 192 and gate dielectric layer 191 can then be patterned (e.g., lithographically), thereby creating a gate structure 190 that traverses the center portions 131a-b and fills the openings 196a-b. As a result, this gate structure 190 is positioned on the first sidewalls 130a of the first center portion 131a and also on the second sidewalls 130b of the second center portion 131b.

It should be noted that, in this case, the first dielectric body 151a and first dielectric spacers 152a will function as a first isolating cap 150a that electrically isolates the top surface of the first center portion 131a from the gate structure 190 and, thereby ensures that only two-dimensional field effects are exhibited by the first center portion 131a. Similarly, the second dielectric body 151b will function as second isolating cap 150b that electrically isolates the top surface of the second center portion 131b from the gate structure 190 and, thereby ensures that only two-dimensional field effects are exhibited by the second center portion 131b. However, optionally, prior to forming the gate structure 190 at process 32, dielectric material can be selectively removed from above the first center portion 131a and/or the second center portion 131b (30). Removing this dielectric material allows three-dimensional field effects to be exhibited.

After the gate structure 190 is formed at process 32, additional conventional processing can be performed in order to complete the MUGFETs 101a-b (34). This additional processing can include, but is not limited to, deposition of interlayer dielectric material, contact formation, etc.

Figure 11C:
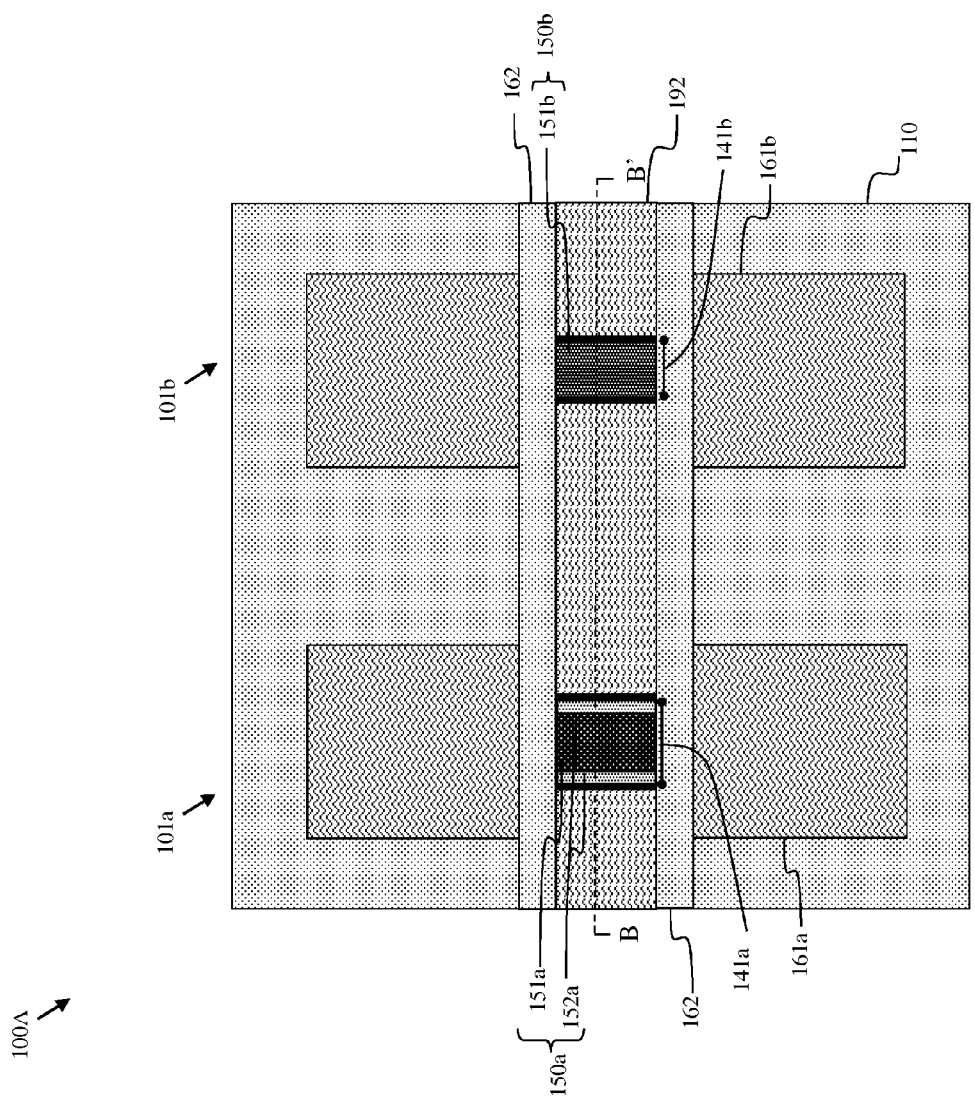
FIG. 11C is another horizontal cross-section drawing of the same completed semiconductor structure as shown in FIG. 11A.
Figure 11D:
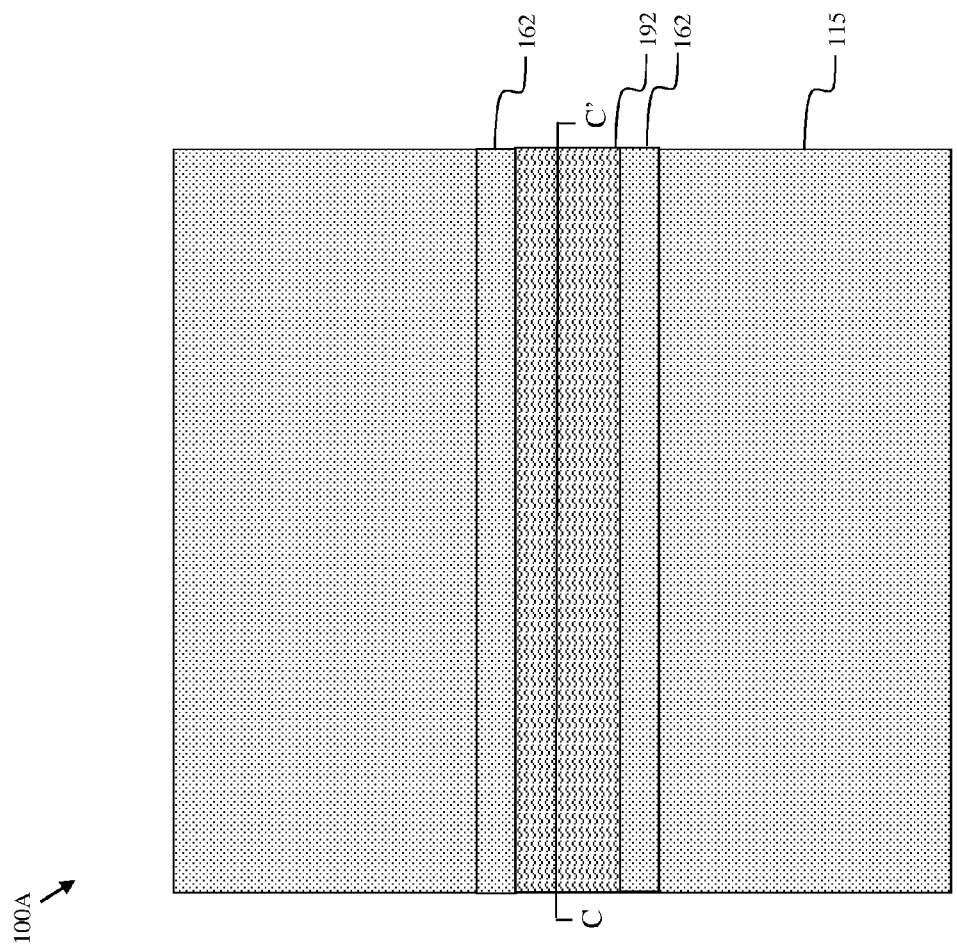
FIG. 11D is yet another horizontal cross-section drawing of the same completed semiconductor structure as shown in FIG. 11A.

FIG. 11A is vertical cross-section illustration of an embodiment of a semiconductor structure 100A formed according to the method of FIG. 1 such that it has multiple fin-shaped channel regions 131a, 131b having different widths 141a, 141b and, optionally, differently configured isolating caps 150a, 150b. FIGS. 11B-11D are different horizontal cross-section illustrations of the same semiconductor structure 100A.

Referring to FIG. 11A, this semiconductor structure 100A can comprise a silicon-on-insulator (SOI) structure. Specifically, the structure 100A can comprise an insulator layer 105 (e.g., a buried oxide (BOX) layer or other suitable insulator layer) and a semiconductor layer (e.g., a silicon layer or other suitable semiconductor layer) on the insulator layer 105. A trench isolation structure 110 (e.g., a shallow trench isolation (STI) structure) can extend vertically through the semiconductor layer to the insulator layer 105 and can define a first semiconductor region 120a for a first MUGFET 101a and a second semiconductor region 120b, positioned laterally adjacent to the first semiconductor region 120a, for a second MUGFET 101b (see also FIG. 11B). That is, a trench isolation structure 110 on the insulator layer 105 can laterally surround the first semiconductor region 120a and the second semiconductor region 120b such that the first semiconductor region 120a is electrically isolated from the second semiconductor region 120b.

The first semiconductor region 120a can have first end portions 132a and a first center portion 131a positioned laterally between the first end portions 132a. The first center portion 131a can comprise a first channel region for the first MUGFET 101a. The first center portion 131a can further be narrower than the first end portions 132b, can have first opposing sidewalls 130a (e.g., can be essentially fin-shaped), can be physically separated from the isolation structure 110 and can have a first width 141a. The first end portions 132a can comprise first source/drain regions and, optionally, other component regions (e.g., first halo regions, first source/drain extension regions, etc.) for the first MUGFET 101a. Optionally, a first isolating cap 150a can be positioned on the top surface of the first center portion 131a and can have the same first width 141a. The first isolating cap 150a can comprise a dielectric body 151a positioned laterally between dielectric spacers 152a. The first width 141a of the first center portion 131a can be essentially equal to the combined width of the dielectric body 151a and the dielectric spacers 152a.

The second semiconductor region 120b can have second end portions 132b and a second center portion 131b positioned laterally between the second end portions 132b. The second center portion 131b can comprise a second channel region for the second MUGFET 101b. The second center portion 131b can further be narrower than the second end portions 132b, can have second opposing sidewalls 130b (e.g., can be essentially fin-shaped), can be physically separated from the isolation structure 110 and can have a second width 141b. The second end portions 132b can comprise second source/drain regions and, optionally, other component regions (e.g., second halo regions, second source/drain extension regions, etc.) for the second MUGFET 101b. Optionally, a second isolating cap 150b be positioned on the top surface of the second center portion 131b and can have the same second width 141b. The second isolating cap 150 can be another dielectric body 151b alone (i.e., without dielectric spacers). The dielectric body 151b can be essentially identical to the dielectric body 151a such that the second width 141b is less than the first width 141a.

A gate structure 190 can traverse the center portions 131a and 131b of both semiconductor regions 120a, 120b. Specifically, a conformal gate dielectric layer 191 (e.g., a gate oxide layer, a high-k gate dielectric layer or other suitable gate dielectric layer) can be positioned on the first opposing sidewalls 130a of the first center portion 131a of the first semiconductor region 120a and also on the second opposing sidewalls 130b of the second center portion 131b of the second semiconductor region 120b. A gate conductor layer 192 (e.g., a metal gate conductor layer, a polysilicon gate conductor layer, a dual work function gate conductor layer or other suitable gate conductor layer) can be positioned on the gate dielectric layer 191. The top surface of the first center portion 131a can, optionally, be electrically isolated from the gate structure 190 by the first isolating cap 150a so that the first center portion 131a exhibits only two-dimensional field effects. Without the first isolating cap 150a, the first center portion 131a can exhibit three-dimensional field effects. Similarly, the top surface of the second center portion 131b can, optionally, be electrically isolated from the gate structure 190 by the second isolating cap 150b so that the second center portion 131b also exhibits only two-dimensional field effects. Without the second isolating cap 150b, the second center portion 131b can exhibit three-dimensional field effects.

Gate sidewall spacers 162 can be positioned on opposing sides of the gate structure 190 and, optionally, metal silicide layers 161a, 161b can be positioned on the top surfaces of the first end portions 132a and second end portions 132b, respectively (see also FIG. 11C). Finally, an interlayer dielectric material 115 can be positioned on the metal silicide layers 161a, 161b above the first and second end portions 132a, 132b of the first and second semiconductor regions 120a, 120b, respectively, and adjacent to the gate sidewall spacers 162 (see also FIG. 11D).

In the above-discussed semiconductor structure 100A, the dielectric bodies 151a-b and the dielectric spacers 152a can comprise different dielectric materials and, particularly, different dielectric materials that allow for selective etching during processing. For example, the dielectric bodies 151a-b can comprise silicon nitride and the dielectric spacers 152a can comprise silicon oxide, silicon oxynitride or silicon carbide. These exemplary dielectric materials are offered for illustration purposes only. It should be understood that other combinations of dielectric materials may alternatively be used. Additionally, in the above-discussed semiconductor structure 100A, the first MUGFET 101a and second MUGFET 101b can be different types of MUGFETs (e.g., an n-type MUGFET and a p-type MUGFET, respectively, or vice versa). Alternatively, the MUGFETs 101a and 101b can be the same type of MUGFET (e.g., both n-type MUGFETs or both p-type MUGFETs).

Figure 12:
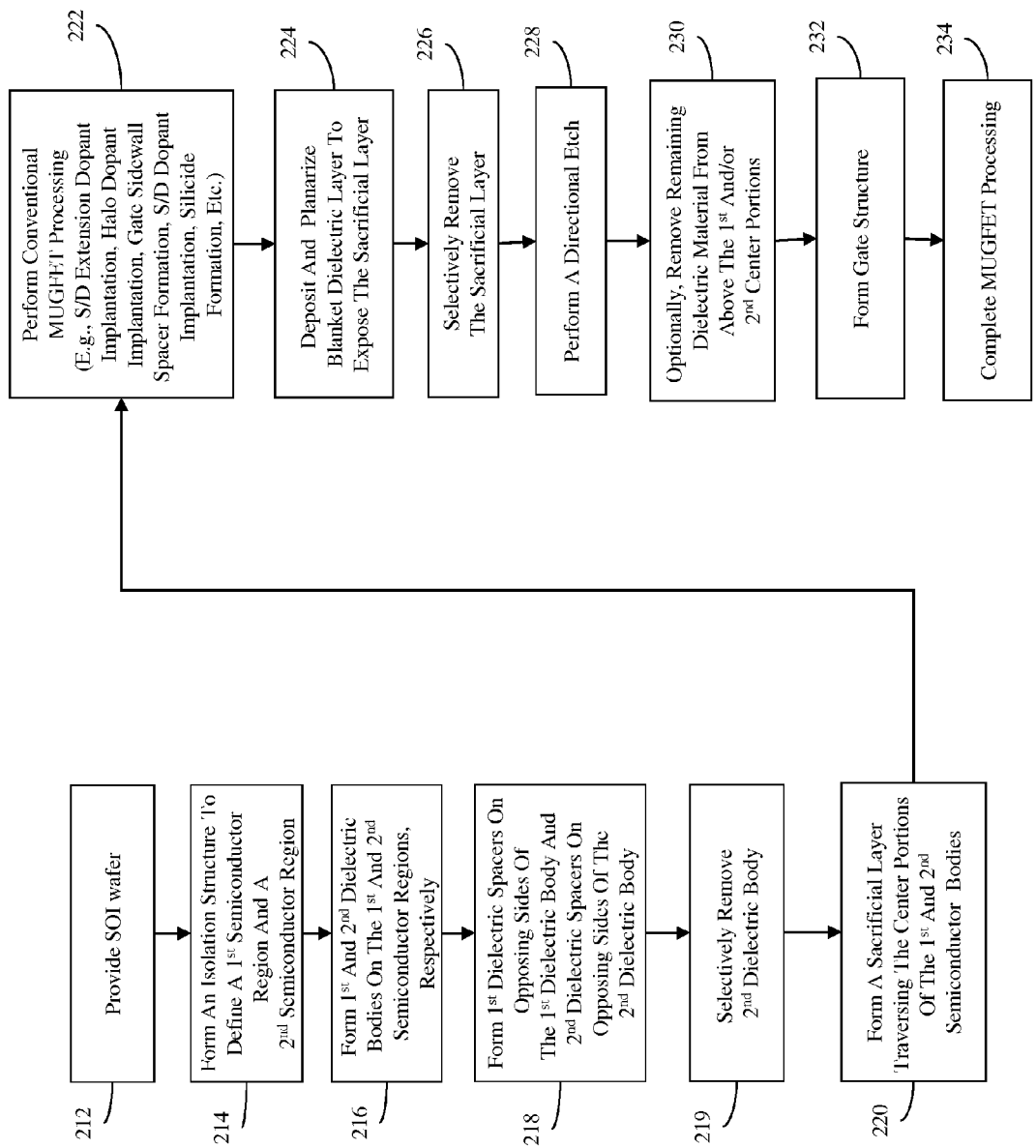
FIG. 12 is a flow diagram illustrating another embodiment of a damascene method of forming a semiconductor structure.

Referring to FIG. 12, another embodiment of a method of forming a semiconductor structure with multiple fin-shaped channel regions having different widths can comprise providing a semiconductor-on-insulator (SOI) wafer (212, see detailed discussion above regarding process step 12 of FIG. 1). Next, a trench isolation structure 110 (e.g., a shallow trench isolation (STI) structure) can be formed so as to define, in the semiconductor layer on the insulator layer 105, a first semiconductor region 120a for a first non-planar multi-gate field effect transistor (MUGFET) and a second semiconductor region 120b, positioned laterally adjacent to the first semiconductor region 120a, for a second MUGFET (214, see FIGS. 2A and 2B and detail discussion above regarding process step 14 of FIG. 1).

After the first semiconductor region 120a and second semiconductor region 120b are defined at process 214, a first dielectric body 151a can be formed on the first semiconductor region 120a and at the same time a second dielectric body 151b can be formed on the second semiconductor region 120b (216, see FIGS. 3A and 3B and detailed discussion above regarding process step 16 of FIG. 1). For example, the first dielectric body 151a and the second dielectric body 151b can specifically be formed so that they are essentially identical, so that they traverse the length of the first semiconductor region 120a and second semiconductor region 120b, respectively, and further so that they are narrower than the first semiconductor region 120a and the second semiconductor region 120b, respectively. This can be accomplished, for example, by depositing a first dielectric hardmask layer and, then, patterning the first dielectric hardmask layer lithographically to form the discrete dielectric bodies 151a-b.

Once the first dielectric body 151a and second dielectric body 151b are formed, first dielectric spacers 152a can be formed on first opposing sides 153a of the first dielectric body 152a and at the same time second dielectric spacers 152b can be formed on the second opposing sides 153b of the second dielectric body 152b (218, see FIGS. 13A-13B). This can be accomplished, for example, by depositing a conformal second dielectric hardmask layer. The second dielectric hardmask layer can be selectively and anisotropically etched to form first dielectric spacers 152a on the opposing sides 153a of the first dielectric body 151a and second dielectric spacers 152b on the opposing sides 153b of the second dielectric body 151b. This second dielectric hardmask layer can comprise a different dielectric hardmask material than the first dielectric hardmask layer that was previously used at process 216 to form the first and second dielectric bodies 151a-b.

Next, the first semiconductor region 120a can be masked and the second dielectric body 151a can be selectively removed (219, see FIGS. 14A and 14B). As mentioned above, the dielectric bodies 151a-b and the dielectric spacers 152a-b should be formed so that they comprise different dielectric materials and, particularly, different dielectric materials that allow for selective etching of the second dielectric body 151b over the second dielectric spacers 152b. For example, the dielectric bodies 151a-b can be formed with silicon nitride and the dielectric spacers 152a-b can be formed with silicon oxide, silicon oxynitride or silicon carbide. These exemplary dielectric materials are offered for illustration purposes only and it should be understood that other combinations of dielectric materials may alternatively be used. Following process step 219, the mask on the first semiconductor region 120a can be removed.

Figure 15A:
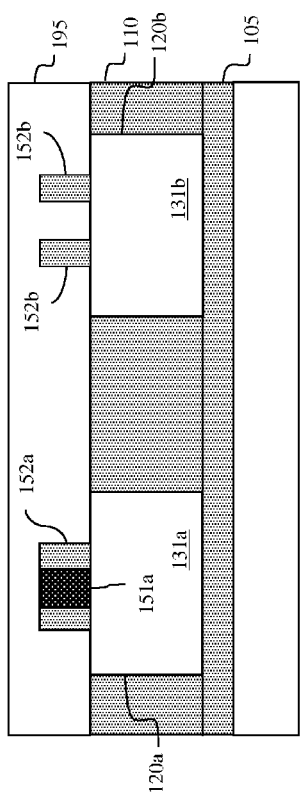
FIG. 15A is a cross-section drawing illustrating a partially completed semiconductor structure formed according to the method of FIG. 12.
Figure 15B:
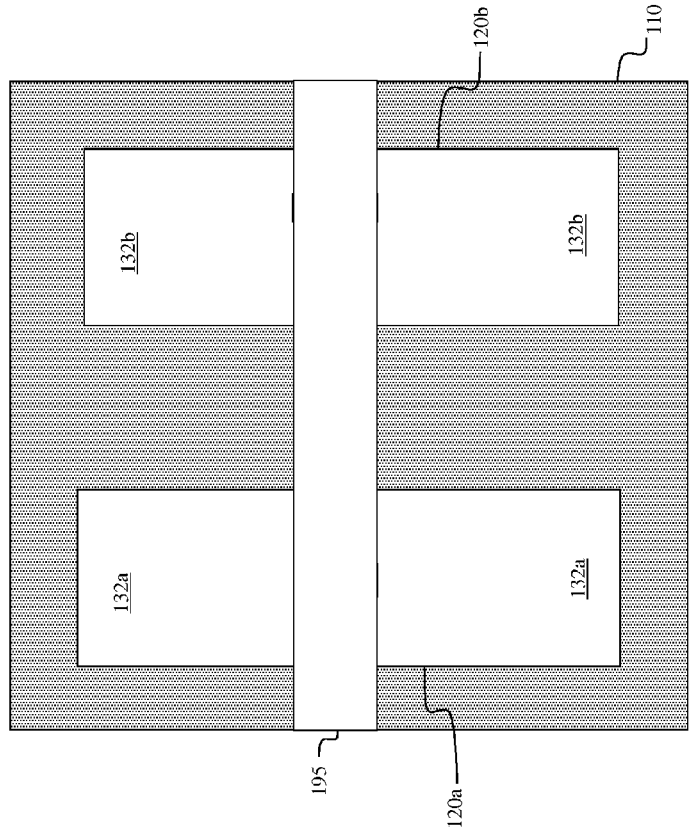
FIG. 15B is a top view drawing of the same partially completed semiconductor structure as shown in FIG. 15A.

Next, a sacrificial layer 195 (i.e., a sacrificial gate structure, a replacement gate structure, etc.) can be formed (220, see FIGS. 15A-15B). This sacrificial layer 195 can comprise, for example, a polysilicon layer or other material that can be selectively etched at process 214, discussed below. Specifically, this sacrificial layer 195 can be deposited and patterned (e.g., lithographically) so that it traverses the center portion 131a (i.e., the first center portion or first designated channel region) of the first semiconductor region 120a, leaving the end portions 132a of the first semiconductor region 120a (i.e., the first end portions) exposed and also traversing the center portion 131b (i.e., the second center portion or second designated channel region) of the second semiconductor region 120b, leaving the end portions 132b of the second semiconductor region 120b (i.e., the second end portions) exposed. It should be noted that this process 220 will remove all remaining dielectric material (i.e., the first dielectric body 151a, first dielectric spacers 152a, and second dielectric spacers 152b) from above the first and second end portions 132a-b, while leaving intact the dielectric material above the first and second center portions 131a-b.

Figure 16:
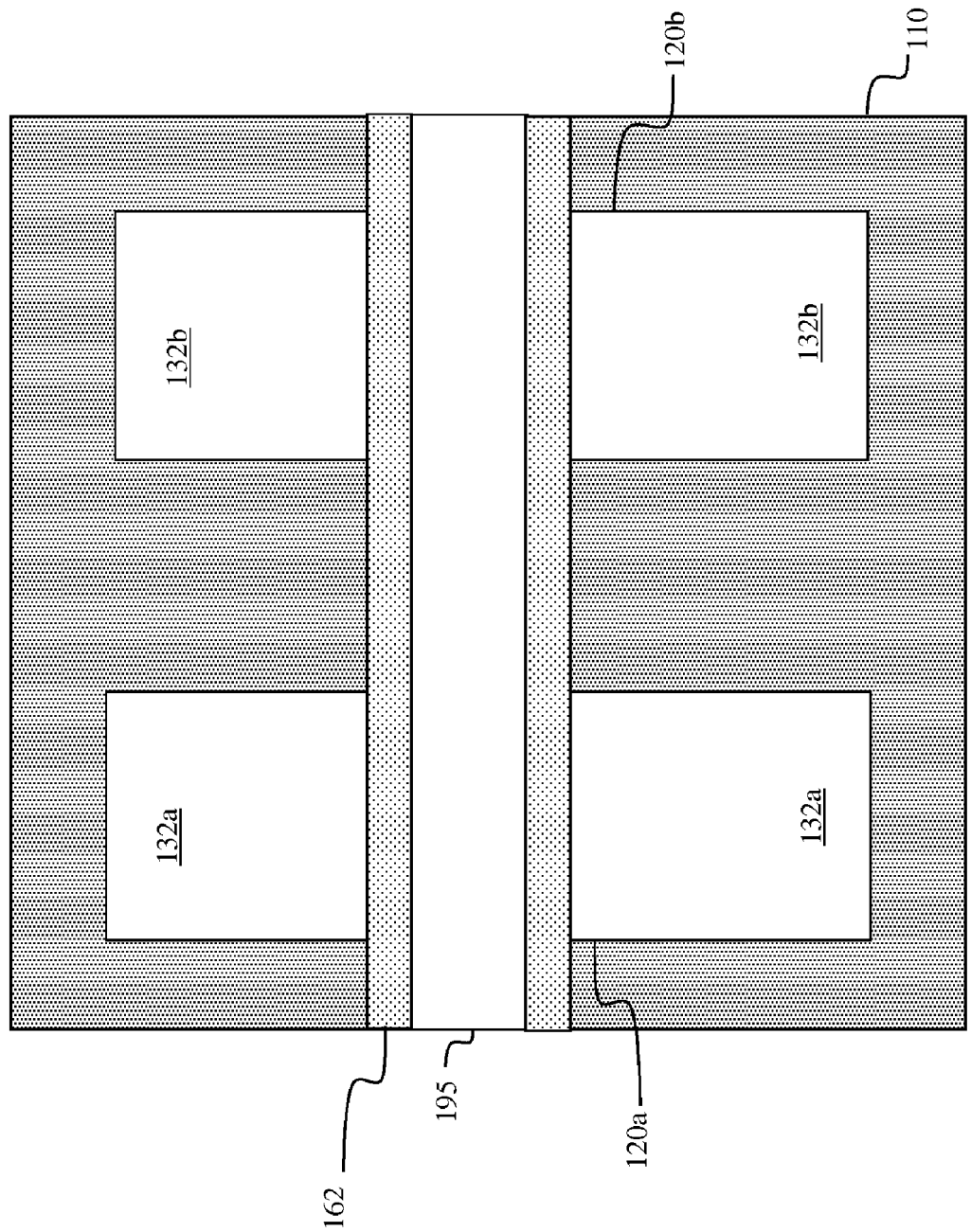
FIG. 16 is a top view drawing of a partially completed semiconductor structure formed according to the method of FIG. 12.

After the sacrificial layer 195 is formed at process 220, conventional MUGFET processing can be performed (222). This conventional MUGFET processing can include, but is not limited to, source/drain extension dopant implantation, halo dopant implantation, gate sidewall spacer 162 formation (see FIG. 16), source/drain dopant implantation into the first and second end portions 132a-b and silicide layer formation on the top surfaces of the first and second end portions 132a-b. It should be noted that this conventional processing will vary depending upon whether the MUGFETs being formed in the first semiconductor region 120a and the second semiconductor region are to have the same conductivity type (e.g., n-type or p-type) or opposite conductivity types (e.g., n-type and p-type, respectively). For example, if the MUGFETs are to have the same conductivity type the various dopant implantation processes can be performed essentially simultaneously. However, if the MUGFETs are to have opposite conductivity types, the end portions of one semiconductor region can be masked while dopant implantation is performed on the end portions of the other semiconductor region and vice versa.

Figure 17:
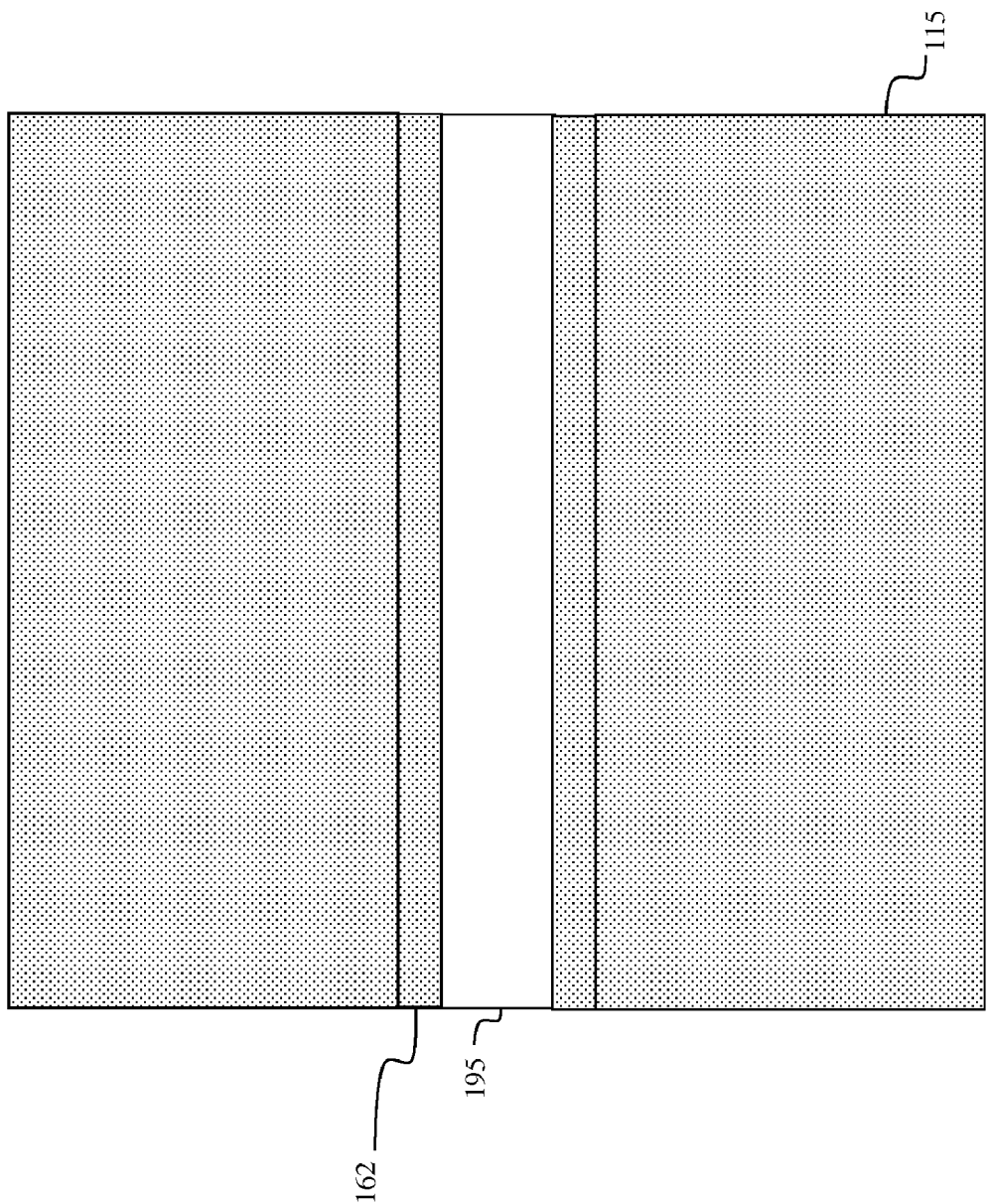
FIG. 17 is a top view drawing of a partially completed semiconductor structure formed according to the method of FIG. 12.

Next, a blanket dielectric layer 115 (e.g., an interlayer dielectric) can be formed (e.g., deposited) such that it extends over the sacrificial layer 195, the gate sidewall spacers 162, the first end portions 132a and the second end portions 132b. The blanket dielectric layer 115 can then be planarized (e.g., using a conventional chemical mechanical polishing (CMP) process) to expose the top surface of the sacrificial layer 195 (224, see FIG. 17). Once exposed, the sacrificial layer 195 can be selectively removed (e.g., using a selective etch process) (226, see FIGS. 18A and 18B). This process 226 exposes the remaining portions of the first dielectric body 151a and the first dielectric spacers 152a as well as sections of the first center portion 131a of the first semiconductor region 120a between the first dielectric spacers 152a and the isolation structure 110. This process 226 also exposes the remaining portions of the second dielectric spacers 152b as well as sections of the second center portion 131b of the second semiconductor region 120b between each of the second dielectric spacers 152b and further between the second dielectric spacers 152b and the isolation structure 110. Finally, this process 226 leaves the gate sidewall spacers 162 and dielectric layer 115 essentially intact.

Figure 19A:
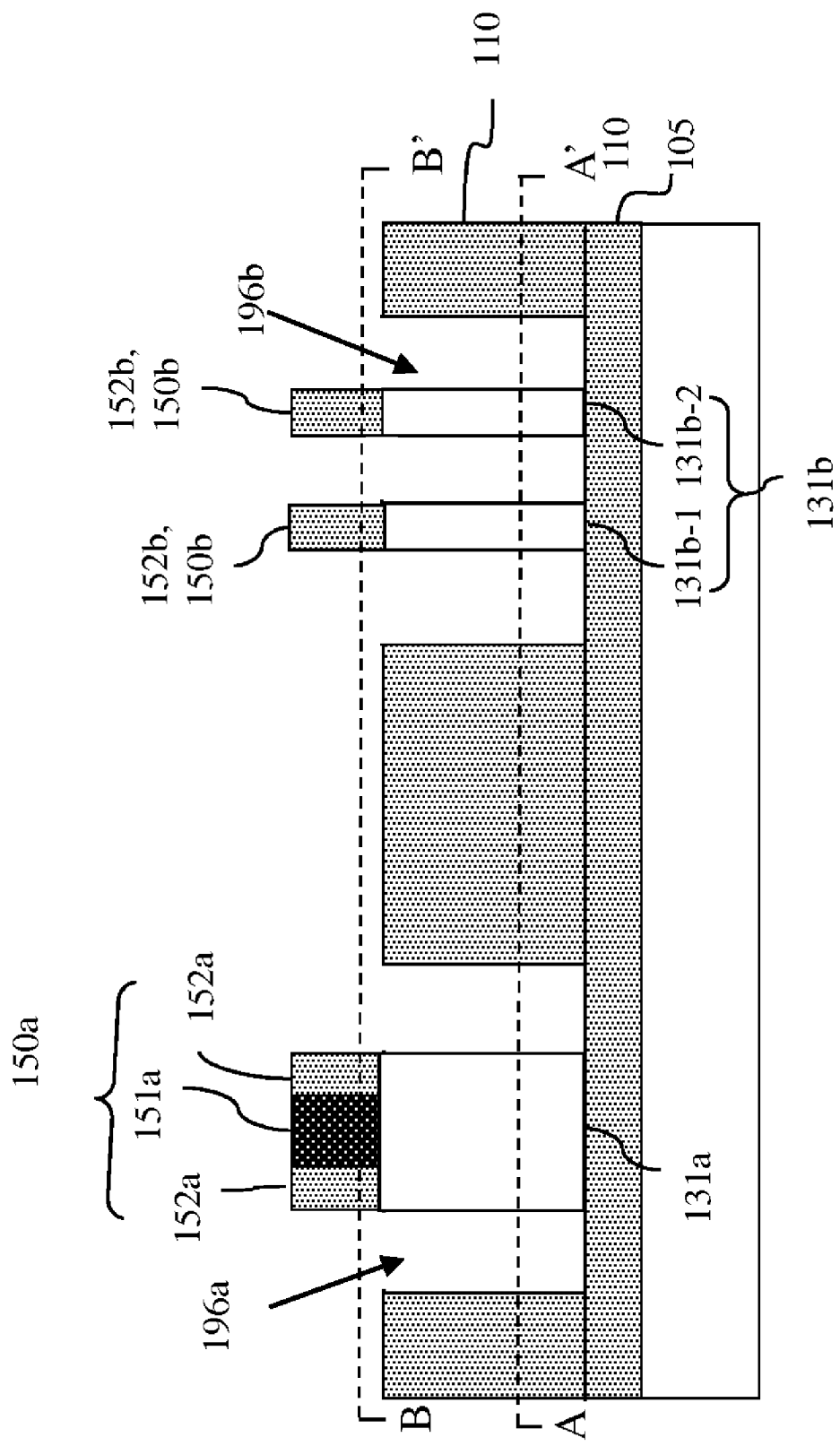
FIG. 19A is a vertical cross-section drawing illustrating a partially completed semiconductor structure formed according to the method of FIG. 12.
Figure 19B:
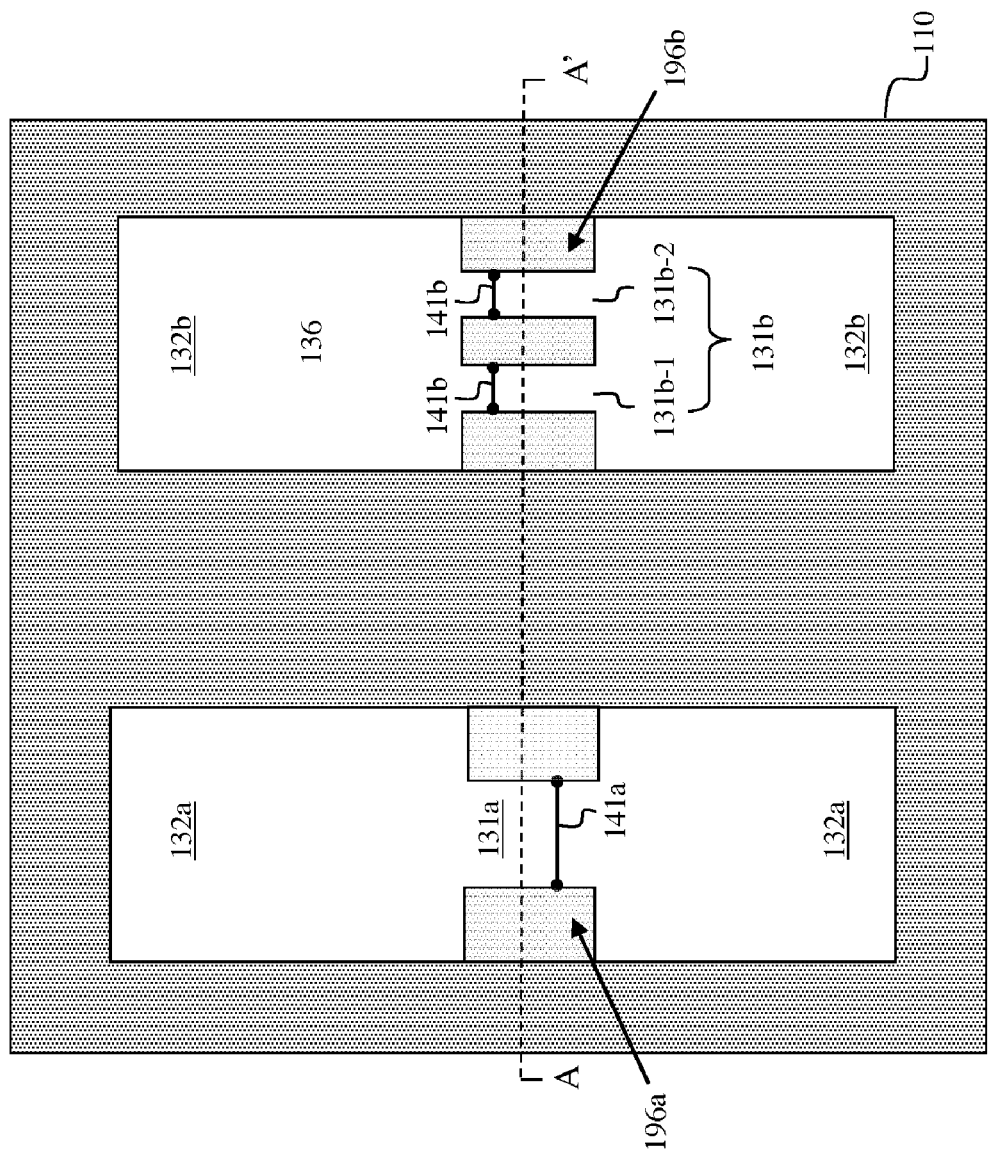
FIG. 19B is a horizontal cross-section drawing of the same partially completed semiconductor structure as shown in FIG. 19A.
Figure 19C:
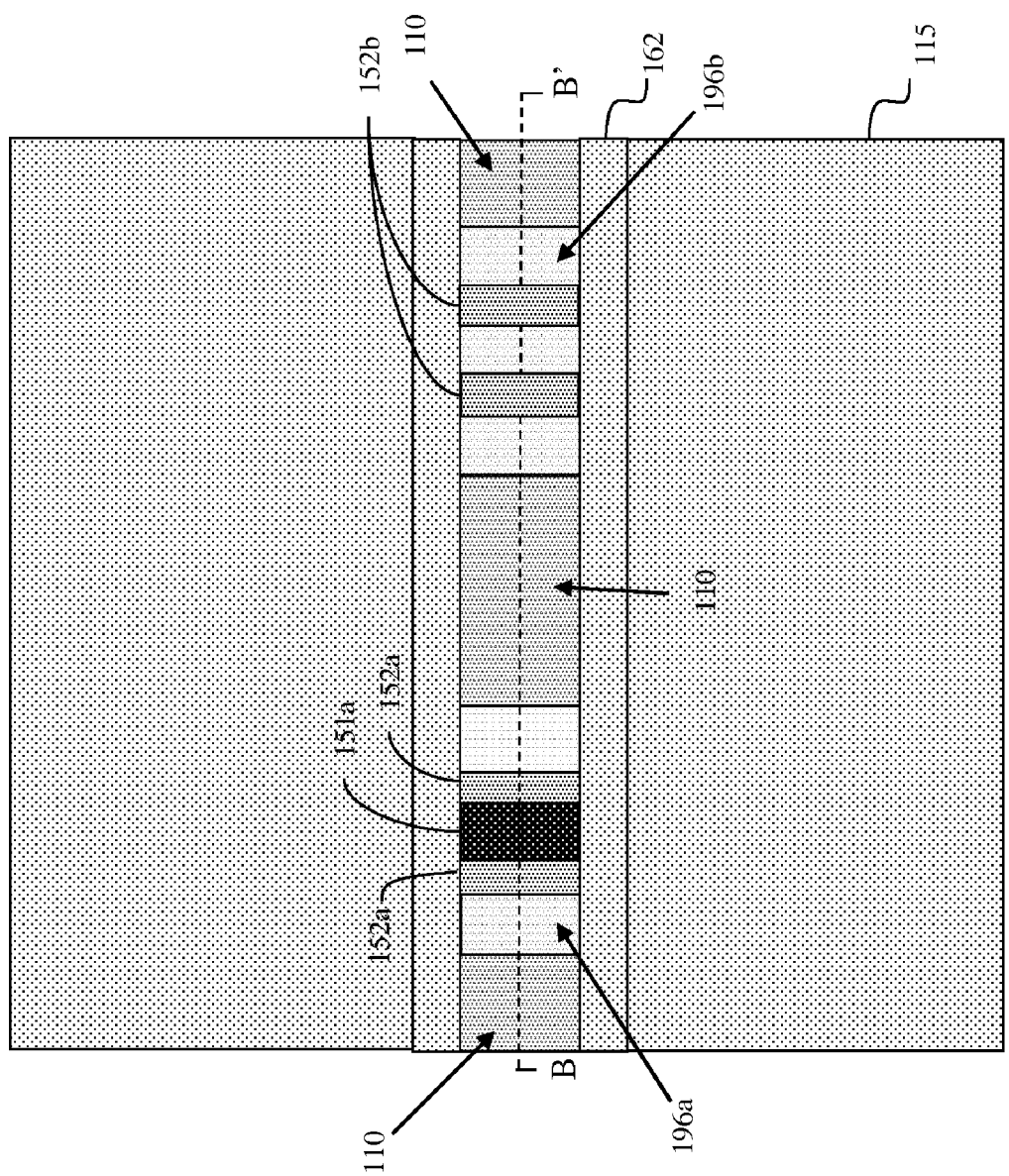
FIG. 19C is another horizontal cross-section drawing of the same partially completed semiconductor structure as shown in FIG. 19A.

Next, a directional etch process (e.g., a reactive ion etch (RIE) process) can be performed so as to remove exposed semiconductor material within the first center portion 131a of the first semiconductor region 120a and the second center portion 131b of the second semiconductor regions 120b (228, see FIGS. 19A-19C). During this etch process 228, the dielectric layer 115 on the first end portions 132a and the second end portions 132b, the first dielectric body 151a and the first dielectric spacers 152a on the first center portion 131a and the second dielectric spacers 152b on the second center portion 131b are used as masks. Thus, this directional etch process 228 forms openings 196a-196b that stop on the insulator layer 105 and, thereby turns the first center portion 131a (i.e., the first channel region) of the first semiconductor region 120a into an essentially fin-shaped structure and the second center portion 131b (i.e., the second channel region) of the second semiconductor region 120b into two parallel essentially fin-shaped structures 131b-1 and 131b-2. More particularly, as a result of this directional etch process 228, the first center portion 131b of the first semiconductor region 120a will be narrower than the first end portions 132b and will have a first width 141a that is essentially equal to the combined width of the first dielectric body 151a and the first dielectric spacers 152a. Also as a result of this directional etch process 228, the second center portion 131b will have two parallel sections 131b-1 and 131b-2. Each of theses parallel sections 131b-1 and 131b-2 will be essentially fin-shaped and will have a second width 141b. This second width 141b will be less than the first width 141a of the first center portion 131a and, specifically, will be essentially equal to the width of a corresponding one of the second dielectric spacers 152b (see FIG. 19B).

Figure 20A:
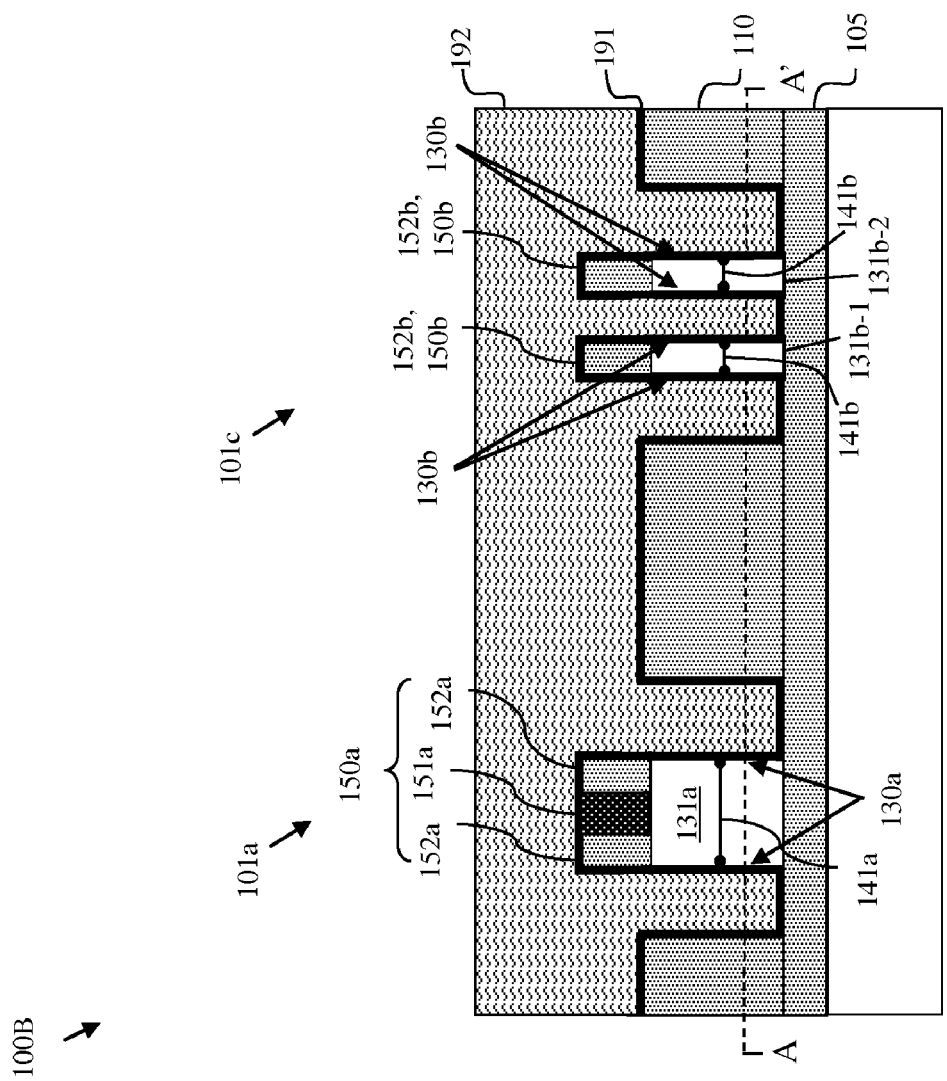
FIG. 20A is a vertical cross-section drawing illustrating a completed semiconductor structure formed according to the method of FIG. 12.
Figure 20B:
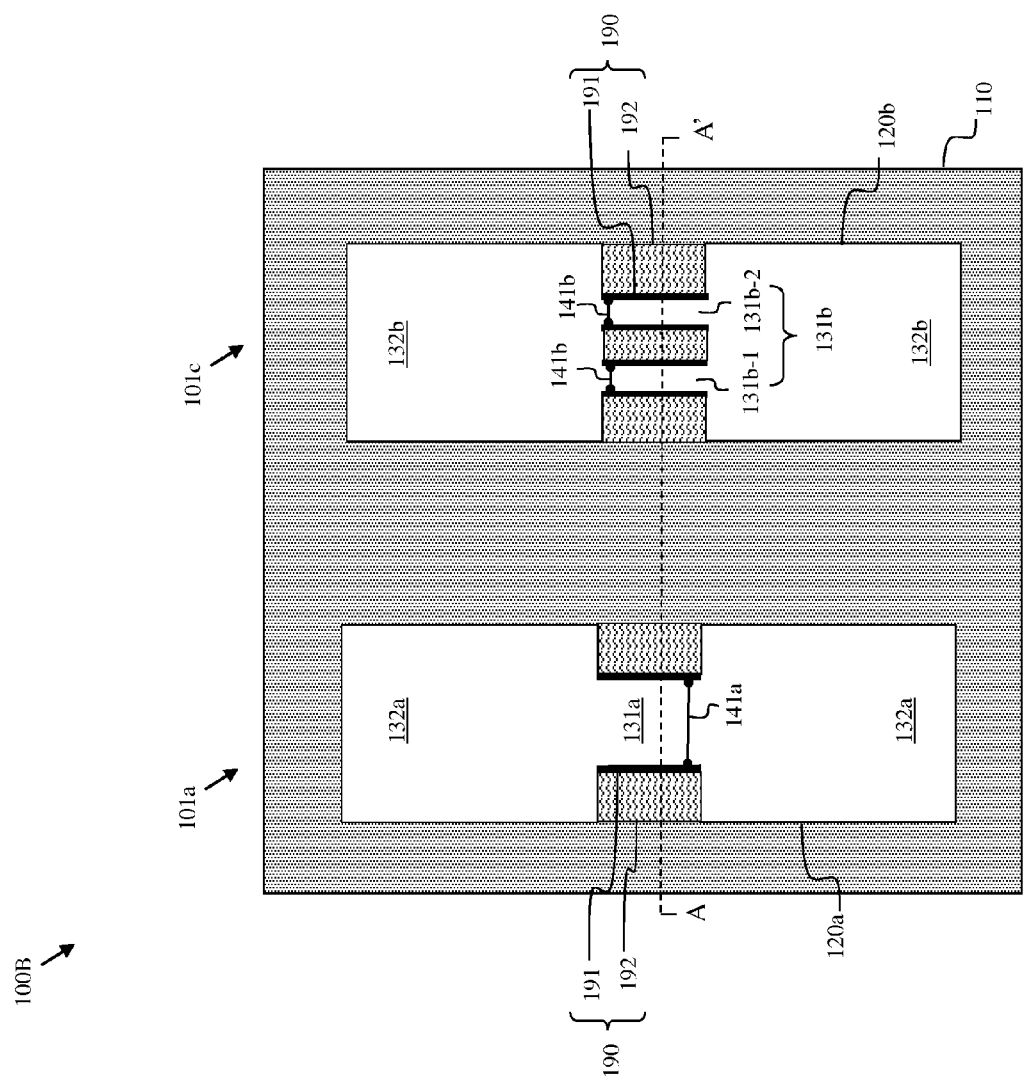
FIG. 20B is a horizontal cross-section drawing of the same completed semiconductor structure as shown in FIG. 20A.

After performing the directional etch process 228, a gate structure 190 can be formed on the exposed first sidewalls 130a of the first center portion 131a and on the exposed second sidewalls 130b of the parallel sections 131b-1 and 131b-2 of the second center portion 131b (232, see FIGS. 20A-B). For example, a conformal gate dielectric layer 191 (e.g., a gate oxide layer, a high-k gate dielectric layer or other suitable gate dielectric layer) can be formed (e.g., deposited) and a gate conductor layer 192 (e.g., a metal gate conductor layer, a polysilicon gate conductor layer, a dual work function gate conductor layer or other suitable gate conductor layer) can be formed (e.g., deposited) on the gate dielectric layer 191. The gate conductor layer 192 and gate dielectric layer 191 can then be patterned (e.g., lithographically), thereby creating a gate structure 190 that traverses the center portions 131a-b and fills the openings 196a-b. As a result, this gate structure 190 is positioned on the first sidewalls 130a of the first center portion 131a and also on the second sidewalls 130b of the parallel sections 131b-1 and 131b-2 of the second center portion 131b.

It should be noted that, in this case, the first dielectric body 151a and first dielectric spacers 152a will function as a first isolating cap 150a that electrically isolates the top surface of the first center portion 131a from the gate structure 190 and, thereby ensures that only two-dimensional field effects are exhibited by the first center portion 131a. Similarly, the second dielectric spacers 152b will function as discrete second isolating caps 150b that electrically isolate the top surfaces of the parallel sections 131b-1 and 131b-2 from the gate structure 190 and, thereby ensure that only two-dimensional field effects are exhibited by the parallel sections 131b-1 and 131b-2. However, optionally, prior to forming the gate structure 190 at process 232, dielectric material can be selectively removed from above the first center portion 131a and/or from above the parallel sections 131b-1 and 131b-2 of the second center portion 131b. Removing this dielectric material allows three-dimensional field effects to be exhibited (230).

After the gate structure 190 is formed at process 332, additional conventional processing can be performed in order to complete the single-fin MUGFET 101a and multi-fin MUGFET 101c (234). This additional processing can include, but is not limited to, deposition of interlayer dielectric material, contact formation, etc.

FIG. 20A is vertical cross-section illustration of an embodiment of a semiconductor structure 100B formed according to the method of FIG. 12 such that it has multiple fin-shaped channel regions 131a, 131b-1, 131b-2 having different widths 141a, 141b and, optionally, differently configured isolating caps 150a, 150b. FIG. 20B is a horizontal cross-section illustration of the same semiconductor structure 100B.

Referring to FIG. 20A, this semiconductor structure 100B can comprise a silicon-on-insulator (SOI) structure. Specifically, the structure 100B can comprise an insulator layer 105 (e.g., a buried oxide (BOX) layer or other suitable insulator layer) and a semiconductor layer (e.g., a silicon layer or other suitable semiconductor layer) on the insulator layer 105. A trench isolation structure 110 (e.g., a shallow trench isolation (STI) structure) can extend vertically through the semiconductor layer to the insulator layer 105 and can define a first semiconductor region 120a for a first MUGFET 101a and a second semiconductor region 120b, positioned laterally adjacent to the first semiconductor region 120a, for a second MUGFET 101c and, particularly, a multi-fin MUGFET 101c (see also FIG. 20B). That is, a trench isolation structure 110 on the insulator layer 105 can laterally surround the first semiconductor region 120a and the second semiconductor region 120b such that the first semiconductor region 120a is electrically isolated from the second semiconductor region 120b.

The first semiconductor region 120a can have first end portions 132a and a first center portion 131a positioned laterally between the first end portions 132a. The first center portion 131a can comprise a first channel region for the first MUGFET 101a. The first center portion 131a can further be narrower than the first end portions 132b, can have opposing sidewalls 130a (e.g., can be essentially fin-shaped), can be physically separated from the isolation structure 110 and can have a first width 141a. The first end portions 132a can comprise first source/drain regions and, optionally, other component regions (e.g., first halo regions, first source/drain extension regions, etc.) for the first MUGFET 101a. Optionally, a first isolating cap 150a can be positioned on the top surface of the first center portion 131a and can have the same first width 141a. The first isolating cap 150a can comprise a dielectric body 151a positioned laterally between two dielectric spacers 152a. The first width 141a of the first center portion 131a of the first semiconductor region 120a can be essentially equal to the combined width of the dielectric body 151a and the dielectric spacers 152a.

The second semiconductor region 120b can have second end portions 132b and a second center portion 131b positioned laterally between the second end portions 132b. The second center portion 131b can comprise a second channel region for the second MUGFET 101b. The second center portion 131b can further be narrower than the second end portions 132b and can comprise two parallel sections 131b-1 and 131b-2. Each of these parallel sections 131b-1 and 131b-2 can have opposing sidewalls 130b (e.g., can be essentially fin-shaped), can be physically separated from the isolation structure 110 and can have a second width 141b that is less than the first width 141a. The second end portions 132b can comprise second source/drain regions and, optionally, other component regions (e.g., second halo regions, second source/drain extension regions, etc.) for the second MUGFET 101c. Optionally, second isolating caps 150b can be positioned on the parallel sections 131b-1 and 131b-2 and can have the same second width 141b as the parallel sections. Each second isolating cap 150b can comprise a dielectric spacer 152b that is essentially identical to one of the dielectric spacers 152a of the first isolating cap 150a.

A gate structure 190 can traverse the center portions 131a and 131b of both semiconductor regions 120a, 120b. Specifically, a conformal gate dielectric layer 191 (e.g., a gate oxide layer, a high-k gate dielectric layer or other suitable gate dielectric layer) can be positioned on the first opposing sidewalls 130a of the first center portion 131a of the first semiconductor region 120a and also on the second opposing sidewalls 130b of each of the parallel sections 131b-1 and 131b-2 of the second center portion 131b of the second semiconductor regions 120b. A gate conductor layer 192 (e.g., a metal gate conductor layer, a polysilicon gate conductor layer, a dual work function gate conductor layer or other suitable gate conductor layer) can be positioned on the gate dielectric layer 191. Optionally, the top surface of the first center portion 131a can be electrically isolated from the gate structure 190 by the first isolating cap 150a so that the first center portion 131a exhibits only two-dimensional field effects. However, without the first isolating cap 150a, the first center portion 131a can exhibit three-dimensional field effects. Optionally, the top surfaces of each of the parallel sections 131b-1 and 131b-2 of the second center portion 131b can be electrically isolated from the gate structure 190 by second isolating caps 150b so each of the parallel sections also only exhibit two-dimensional field effects. However, without the second isolating caps 150b, the parallel sections of the second center portion 131b can exhibit three-dimensional field effects.

As with the semiconductor structure 100A, the semiconductor structure 100B can further comprise gate sidewall spacers positioned on opposing sides of the gate structure 190, optional metal silicide layers positioned on the top surfaces of the first end portions 132a and second end portions 132b, respectively, and an interlayer dielectric material positioned on the metal silicide layers above the first and second end portions 132a, 132b of the first and second semiconductor regions 120a, 120b, respectively, and adjacent to the gate sidewall spacers.

In the above-discussed semiconductor structure 100B, the dielectric body 151a and the dielectric spacers 152a-b that make up the isolating caps 150a-b can comprise different dielectric materials and, particularly, different dielectric materials that allow for selective etching during processing. For example, the dielectric body 151a can comprise silicon nitride and the dielectric spacers 152a-b can comprise silicon oxide, silicon oxynitride or silicon carbide. These exemplary dielectric materials are offered for illustration purposes only. It should be understood that other combinations of dielectric materials may alternatively be used. Additionally, in the above-discussed semiconductor structure 100B, the first MUGFET 101a and second MUGFET 101c can be different types of MUGFETs (e.g., an n-type MUGFET and a p-type MUGFET, respectively, or vice versa). Alternatively, the MUGFETs 101a and 101c can be the same type of MUGFET (e.g., both n-type MUGFETs or both p-type MUGFETs).

Figure 21A:
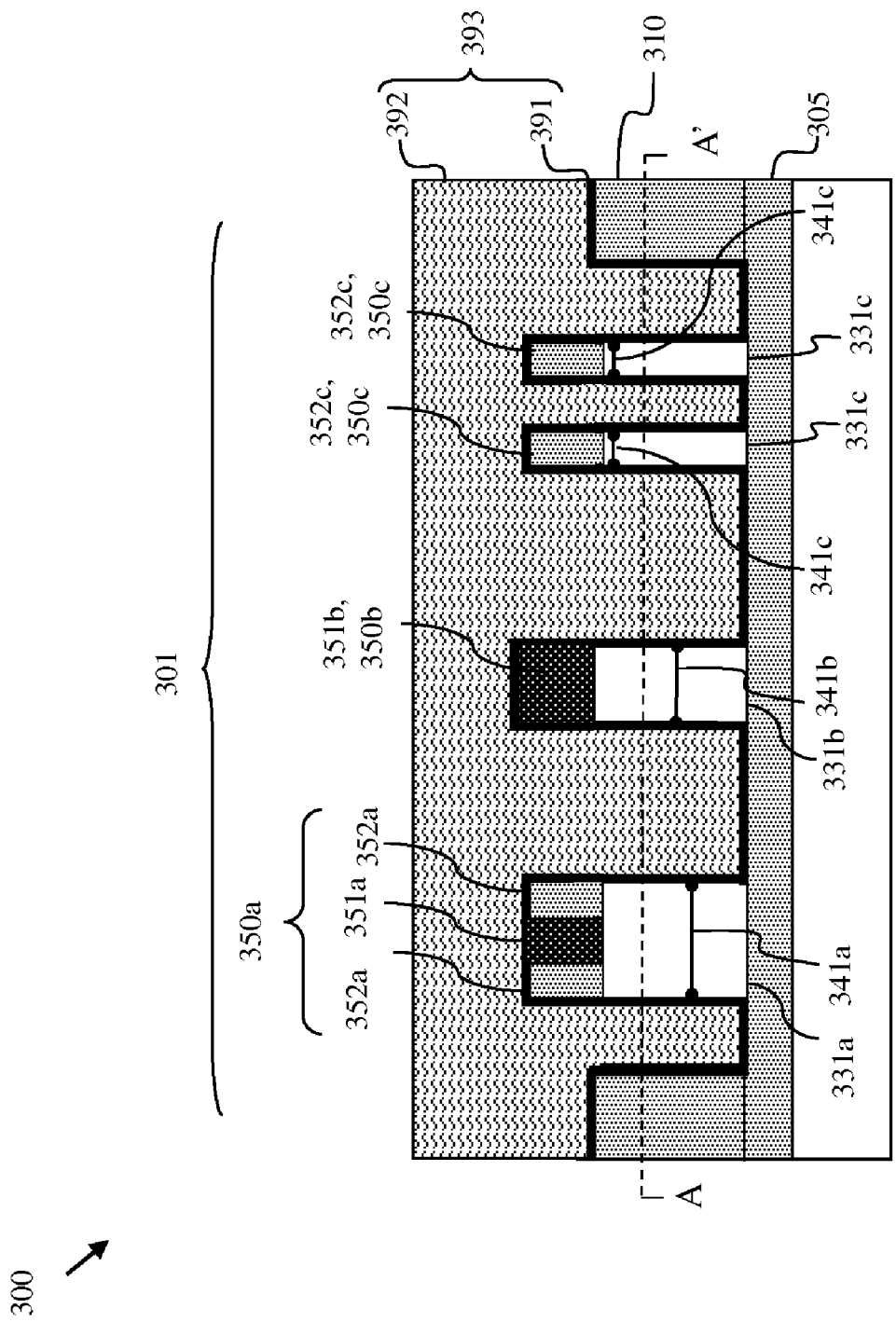
FIG. 21A is a vertical cross-section drawing illustrating another completed semiconductor structure form using similar techniques as shown in FIGS. 1 and 12.

In the exemplary method embodiments described above multiple fin-shaped channel regions with different widths for different MUGFETs (e.g., a first MUGFET and a second MUGFET) are formed in different semiconductor regions (i.e., a first semiconductor region and a second semiconductor region). However, it should be understood that, if desired (e.g., to tune device performance) such multiple fin-shaped channel regions with different widths can be formed in the same semiconductor region for the same MUGFET. For example, FIG. 21A is vertical cross-section illustration of an embodiment of a semiconductor structure 300 having multiple fin-shaped channel regions 331a, 331b, 331c-1, 331c-2 having different widths 341a, 341b and 341c and being incorporated into a single MUGFET 301. FIG. 20B is a horizontal cross-section illustration of the same semiconductor structure 300.

Figure 21B:
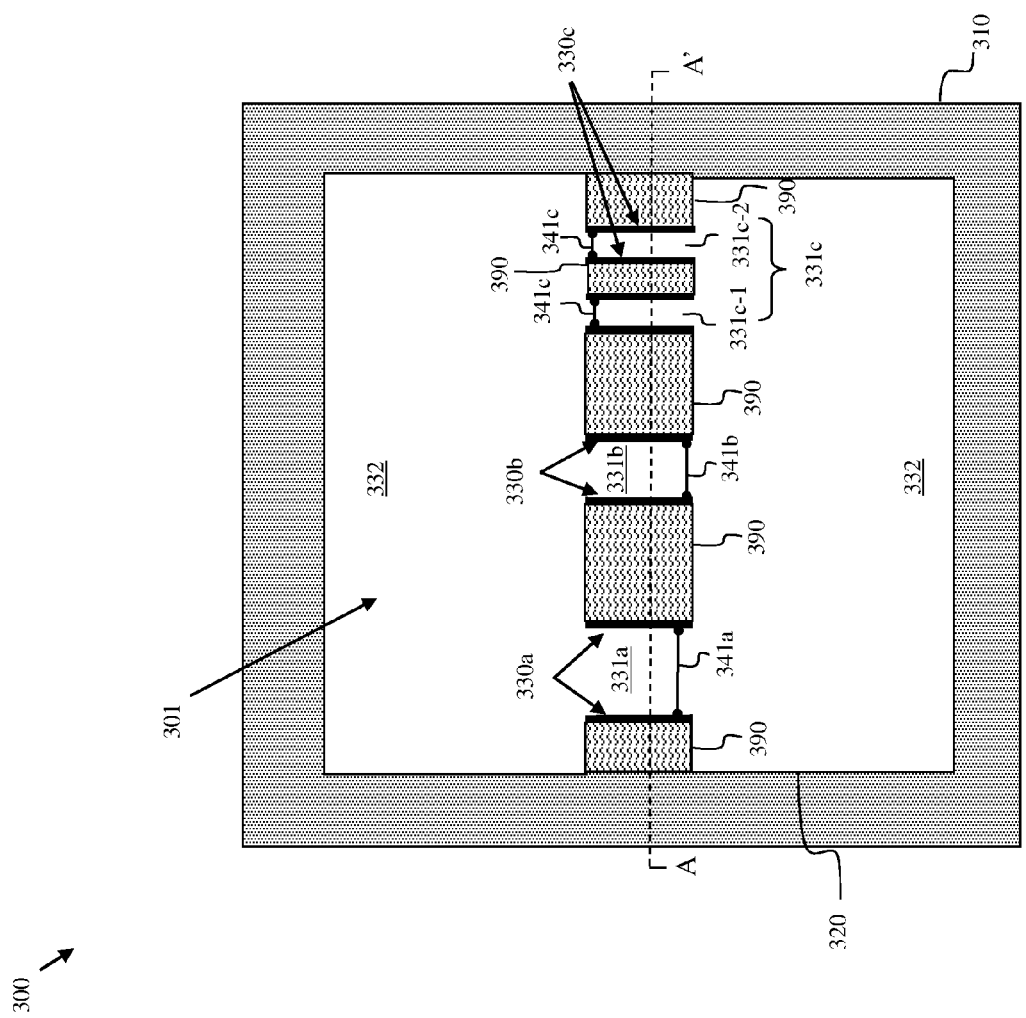
FIG. 21B is a horizontal cross-section drawing of the same completed semiconductor structure as shown in FIG. 21A.

Specifically, referring to FIGS. 21A-21B in combination, this semiconductor structure 300 can comprise an insulator layer 305 (e.g., a buried oxide (BOX) layer or other suitable insulator layer) and a semiconductor layer (e.g., a silicon layer or other suitable semiconductor layer) on the insulator layer 305. A trench isolation structure 310 (e.g., a shallow trench isolation (STI) structure) can extend vertically through the semiconductor layer to the insulator layer 305 and can define a semiconductor region 320. That is, a trench isolation structure 310 on the insulator layer 105 can laterally surround the semiconductor region 320. The semiconductor region 320 can have end portions 332 and a center portion between the end portions 332.

The end portions 332 can comprise source/drain regions and, optionally, other component regions (e.g., first halo regions, first source/drain extension regions, etc.) for the MUGFET 301.

The center portion can be narrower than the end portions 332 and can comprise a plurality of parallel essentially fin-shaped sections (e.g., 331a, 331b, 331c-1 and 331c-2), each comprising a channel region. At least two of the parallel sections (e.g., 331a, 331b, 331c-1 or 331c-2) can have different widths (e.g., 341a, 341b, 341c).

These different widths (e.g., 341a, 341b, 341c) can be defined during processing by differently configured isolating caps 350a, 350b and 350c on the top surfaces of the sections 331a, 331b, 331c-1, 331c-2. The isolating caps 350a, 350b and 350c can, optionally, remain after processing to ensure that the corresponding channel regions exhibit two-dimensional field effects.

For example, a first isolating cap 350a can be positioned on the top surface of the first section 331a. This first isolating cap 350a can comprise a dielectric body 351a positioned laterally between dielectric spacers 352a. The width 341a of the first section 331a can be essentially equal to the combined width of the dielectric body 351a and the dielectric spacers 352a. A second isolating cap 350b can be positioned on the top surface of the second section 331b. This second isolating cap 350b can comprise a dielectric body 351b without dielectric spacers. The width 341b of the second section 331b can be essentially equal to the width of the dielectric body 351b and the dielectric body 351b can be essentially identical to the dielectric body 351a of the first isolating cap 350a. Thus, the width 341b of the second section 331b will be less than the width 341a of the first section 331a. Additionally or alternatively, third isolating caps 350b can be positioned on the top surfaces of the sections 331c-1 and 331c-2. The third isolating caps 350c can each comprise a dielectric spacer 352c. The width 341c of the each third section 331c can be essentially equal to the width of a corresponding dielectric spacer 352c and the corresponding dielectric spacer 352c can be essentially identical to one of the dielectric spacers 352a of the first isolating cap 350a. Thus, the width 341c of the each third section 331c will be less than the width 341a of the first section 331a.

It should be noted that in this structure 300, the dielectric bodies and the dielectric spacers can comprise different dielectric materials and, particularly, different dielectric materials that allow for selective etching during processing. For example, the dielectric bodies can comprise silicon nitride and the dielectric spacers can comprise silicon oxide, silicon oxynitride or silicon carbide. These exemplary dielectric materials are offered for illustration purposes only. It should be understood that other combinations of dielectric materials may alternatively be used.

Additionally, a gate structure 390 can traverse the parallel sections (e.g., 331a, 331b, etc.). Specifically, a conformal gate dielectric layer 391 (e.g., a gate oxide layer, a high-k gate dielectric layer or other suitable gate dielectric layer) can be positioned on the opposing sidewalls 330a, 330b, 330c of each of the sections 331a, 331b, 331c-1, 331c-2. A gate conductor layer 392 (e.g., a metal gate conductor layer, a polysilicon gate conductor layer, a dual work function gate conductor layer or other suitable gate conductor layer) can be positioned on the gate dielectric layer 391. The top surfaces of each of these sections 331a, 331b, 331c-1, 331c-2 can, optionally, be electrically isolated from the gate structure 390 by the isolating caps 350a-c so that each section only exhibits two-dimensional field effects. However, if, during processing any of the isolating caps 350a-c are removed, the corresponding sections will exhibit three-dimensional field effects.

It should be understood that the method embodiments, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, it should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of a damascene method for forming a semiconductor structure and also the resulting semiconductor structure having multiple fin-shaped channel regions with different widths. During damascene processing and, particularly, after source/drain and other dopant implantation processes are performed, fin-shaped channel regions are etched using differently configured isolating caps as masks to define the different channel region widths. For example, a wide width isolating cap can comprise a dielectric body positioned laterally between dielectric spacers and can be used as a mask to define a relatively wide width channel region; a medium width isolating cap can comprise a dielectric body alone and can be used as a mask to define a medium width channel region and/or a narrow width isolating cap can comprise a dielectric spacer alone and can be used as a mask to define a relatively narrow width channel region. These multiple fin-shaped channel regions with different widths can be incorporated into either multiple different non-planar multi-gate field effect transistors (MUGFETs) or a single MUGFET. By defining the fin-shaped channel regions after source/drain and other dopant implantation processes are performed, channel region damage can be avoided.

What is claimed is:

1. A method of forming a semiconductor structure, said method comprising:

forming a trench isolation structure to define, in a semiconductor layer, a first semiconductor region and a second semiconductor region positioned laterally adjacent to said first semiconductor region;

forming a first dielectric body on said first semiconductor region and a second dielectric body on said second semiconductor region;

forming first dielectric spacers on first opposing sides of said first dielectric body;

forming a sacrificial layer traversing a first center portion of said first semiconductor region over said first dielectric body and said first dielectric spacers and also traversing a second center portion of said second semiconductor region over said second dielectric body;

depositing a blanket dielectric layer so as to cover first end portions of said first semiconductor region and second end portions of said second semiconductor region;

planarizing said dielectric layer to expose said sacrificial layer;

selectively removing said sacrificial layer;

performing a directional etch process to remove exposed semiconductor material within said first center portion and said second center portion such that, after said performing of said directional etch process, said first center portion has a first width and said second center portion has a second width that is less than said first width.

2. The method of claim 1, further comprising:
during said forming of said first dielectric spacers also forming second dielectric spacers on second opposing sides of said second dielectric body; and
after said forming of said first dielectric spacers and said second dielectric spacers, selectively removing said second dielectric spacers.

3. The method of claim 1, said directional etch process being performed using, as masks, said dielectric layer on said first end portions and said second end portions, said first dielectric body and said first dielectric spacers on said first center portion and said second dielectric body on said second center portion.

4. The method of claim 1,
said first dielectric body and said second dielectric body being formed with a first dielectric material and
said first dielectric spacers and said second dielectric spacers being formed with a second dielectric material different from said first dielectric material.

5. The method of claim 1, further comprising, after said performing of said directional etch process, forming a gate structure on exposed first sidewalls of said first center portion and on exposed second sidewalls of said second center portion.

6. The method of claim 5, further comprising, before said forming of said gate structure, selectively removing dielectric material from above at least one of said first center portion and said second center portion.

7. A method of forming a semiconductor structure, said method comprising:
forming a trench isolation structure to define, in a semiconductor layer, a first semiconductor region and a second semiconductor region positioned laterally adjacent to said first semiconductor region;
forming a first dielectric body on said first semiconductor region and a second dielectric body on said second semiconductor region;
forming first dielectric spacers on first opposing sides of said first dielectric body and second dielectric spacers on second opposing sides of said second dielectric body;
selectively removing said second dielectric body;
forming a sacrificial layer traversing a first center portion of said first semiconductor region over said first dielectric body and said first dielectric spacers and also traversing a second center portion of said second semiconductor region over said second dielectric spacers;
depositing a blanket dielectric layer so as to cover first end portions of said first semiconductor region and second end portions of said second semiconductor region;
planarizing said dielectric layer to expose said sacrificial layer;
selectively removing said sacrificial layer;
performing a directional etch process to remove exposed semiconductor material within said first center portion and said second center portion such that, after said performing of said directional etch process, said first center portion has a first width and said second center portion comprises two parallel sections, each of said parallel sections having a second width that is less than said first width.

8. The method of claim 7, said directional etch process being performed using, as masks, said dielectric layer on said first end portions and said second end portions, said first dielectric body and said first dielectric spacers on said first center portion and said second dielectric spacers on said second center portion.

9. The method of claim 7,
said first dielectric body and said second dielectric body being formed with a first dielectric material,
said first dielectric spacers and said second dielectric spacers being formed with a second dielectric material different from said first dielectric material.

10. The method of claim 7, further comprising: after said performing of said directional etch process, forming a gate structure on first sidewalls of said first center portion and on second sidewalls of said parallel sections of said second center portion.

* * * * *